United States Patent
Park et al.

(10) Patent No.: US 10,770,384 B2
(45) Date of Patent: Sep. 8, 2020

(54) PRINTED CIRCUIT BOARD HAVING INSULATING METAL OXIDE LAYER COVERING CONNECTION PAD

(71) Applicant: Samsung Electronics Co., Ltd., Suwon-si, Gyeonggi-do (KR)

(72) Inventors: Soo-jae Park, Asan-si (KR); Moon-gi Cho, Anyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 143 days.

(21) Appl. No.: 15/803,831

(22) Filed: Nov. 5, 2017

(65) Prior Publication Data

US 2018/0247887 A1 Aug. 30, 2018

(30) Foreign Application Priority Data

Feb. 24, 2017 (KR) .................. 10-2017-0024920

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 21/4853* (2013.01); *H01L 21/6835* (2013.01); *H01L 23/145* (2013.01); *H01L 23/49816* (2013.01); *H01L 23/49827* (2013.01); *H01L 23/49866* (2013.01);
(Continued)

(58) Field of Classification Search
CPC ......... H01L 23/49838; H01L 23/49816; H01L 23/49827; H01L 23/49866; H01L 23/49894; H01L 21/4853; H01L 21/486; H01L 21/6835; H01L 24/48
See application file for complete search history.

(56) References Cited

U.S. PATENT DOCUMENTS 8,207,052 B2   6/2012   Hua et al.
9,099,534 B2   8/2015   Watanabe et al.
(Continued)

FOREIGN PATENT DOCUMENTS

JP   5396750 B2         1/2014
KR   20160132229 A      11/2016
KR   20170081948 A      7/2017

OTHER PUBLICATIONS

Evertsson, J. et al., "The thickness of native oxides on aluminum alloys and single crystals", Applied Surface Science 349 (2015) 826-832, 2015 Elsevier B.V., Received Jan. 8, 2015, Received in revised form Apr. 22, 2015, Accepted May 8, 2015, Available online May 16, 2015.
(Continued)

*Primary Examiner* — Matthew E. Gordon
(74) *Attorney, Agent, or Firm* — Renaissance IP Law Group LLP

(57) ABSTRACT

A printed circuit board (PCB) is provided as follows. A first connection pad and a second connection pad are disposed on a first surface and a second surface of the base substrate layer, respectively. The first connection pad and the second connection pad each includes a first metal. A first pad cover layer covers a top surface of the first connection pad and includes an insulating metal oxide having a second metal different from the first metal.

18 Claims, 24 Drawing Sheets

(51) Int. Cl.
*H01L 21/683* (2006.01)
*H01L 23/14* (2006.01)
*H01L 23/00* (2006.01)
*H01L 23/31* (2006.01)

(52) U.S. Cl.
CPC ........ *H01L 23/49894* (2013.01); *H01L 24/48* (2013.01); *H01L 21/4857* (2013.01); *H01L 23/3128* (2013.01); *H01L 23/49822* (2013.01); *H01L 24/32* (2013.01); *H01L 24/45* (2013.01); *H01L 24/73* (2013.01); *H01L 2221/68345* (2013.01); *H01L 2221/68359* (2013.01); *H01L 2224/32225* (2013.01); *H01L 2224/45144* (2013.01); *H01L 2224/48091* (2013.01); *H01L 2224/48106* (2013.01); *H01L 2224/48228* (2013.01); *H01L 2224/48507* (2013.01); *H01L 2224/73265* (2013.01); *H01L 2924/01029* (2013.01); *H01L 2924/01327* (2013.01)

(56) References Cited

U.S. PATENT DOCUMENTS

| | | | |
|---|---|---|---|
| 9,318,313 | B2 | 4/2016 | Pagani et al. |
| 9,443,817 | B2 | 9/2016 | Okumura et al. |
| 2008/0237866 | A1 | 10/2008 | Wang |
| 2012/0175772 | A1 | 7/2012 | Leung et al. |
| 2014/0144682 | A1 | 5/2014 | Orlowski et al. |
| 2016/0001002 | A1 | 1/2016 | Yodfat et al. |
| 2016/0329275 | A1 | 11/2016 | Park et al. |
| 2017/0186677 | A1* | 6/2017 | Imafuji ................. H01L 21/481 |
| 2017/0194240 | A1 | 7/2017 | Park et al. |
| 2017/0236801 | A1* | 8/2017 | Rogalli ................... H01L 24/05 438/617 |
| 2018/0090429 | A1* | 3/2018 | Kobayashi .............. H01L 24/73 |

OTHER PUBLICATIONS

Kim, Hyung Giun et al., "Microstructural evaluation of interfacial intermetallic compounds in Cu wire bonding with Al and Au pads", Acta Materialia 64 (2014) 356-366, Elsevier Ltd., Received Oct. 1, 2013; accepted Oct. 23, 2013, Available online Nov. 26, 2013.

Xu, H. et al., "Behavior of aluminum oxide, intermetallics and voids in Cu—Al wire bonds", Acta Materialia 59 (2011) 5661-5673, Elsevier Ltd., Received Mar. 31, 2011; accepted May 20, 2011; Available online Jun. 16, 2011.

* cited by examiner

PRINTED CIRCUIT BOARD HAVING INSULATING METAL OXIDE LAYER COVERING CONNECTION PAD

CROSS-REFERENCE TO RELATED APPLICATION

This application claims priority under 35 U.S.C. § 119 to Korean Patent Application No. 10-2017-0024920, filed on Feb. 24, 2017, in the Korean Intellectual Property Office, the disclosure of which is incorporated by reference herein in its entirety.

TECHNICAL FIELD

The inventive concept relates to a printed circuit board (PCB) and a semiconductor package including the PCB, and more particularly, to a PCB including a connection pad mutually connected to a connection terminal, such as via a bonding wire or a solder joint, and a semiconductor package including the PCB.

DISCUSSION OF RELATED ART

Due to the rapid development of the electronics industry and user demand, electronic devices are becoming more compact and their performance demand is increasing. Therefore, as semiconductor packages included in electronic devices also become more compact and performance thereof increases, reliability of a connection pad of a printed circuit board of a semiconductor package is required.

SUMMARY

According to an exemplary embodiment of the present inventive concept, a printed circuit board (PCB) is provided as follows. A first connection pad and a second connection pad are disposed on a first surface and a second surface of the base substrate layer, respectively. The first connection pad and the second connection pad each includes a first metal. A first pad cover layer covers a top surface of the first connection pad and includes an insulating metal oxide having a second metal different from the first metal.

According to an exemplary embodiment of the present inventive concept, a semiconductor package is provided as follows. A first connection pad and a second connection pad are disposed on a first surface and a second surface of a base substrate layer, respectively. The first connection pad and the second connection pad each includes a first metal. A first pad cover layer covers a top surface of the first connection pad, having an insulating metal oxide having a second metal different from the first metal. A semiconductor chip includes a chip pad. A bonding wire includes a first end connected to the chip pad and a second end connected to the first connection pad through the first pad cover layer. The bonding wire includes a third metal different from the first metal.

According to an exemplary embodiment of the present inventive concept, a semiconductor package is provided as follows. A printed circuit board (PCB) includes a base substrate layer, a first connection pad and a second connection pad disposed on a first surface and a second surface of the base substrate layer, respectively, and a first pad cover layer covering a top surface of the first connection pad. A semiconductor chip includes a chip pad. A bonding wire includes a first end connected to the chip pad and a second end connected to the first connection pad through the first pad cover layer. The first pad cover layer has a thickness less than about 0.5 nm. A solder joint is attached onto the second connection pad.

BRIEF DESCRIPTION OF DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

FIGS. 1A through 1K are cross-sectional diagrams showing operations of a method of manufacturing a printed circuit board (PCB), according to an exemplary embodiment of the present inventive concept.

Figure 1A:
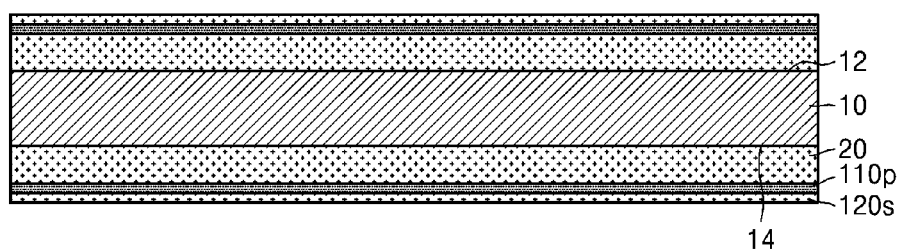
FIGS. 1A through 1K are cross-sectional diagrams showing a method of manufacturing a printed circuit board (PCB), according to an exemplary embodiment of the present inventive concept.

Referring to FIG. 1A, a carrier substrate 10 which has a dummy layer 20, an insulating metal oxide layer 110p, and a first seed layer 120s on each of a top surface 12 and a bottom surface 14 thereof, is prepared.

For example, the carrier substrate 10 may be a prepreg, and the dummy layer 20 may be a copper foil. In this case, the carrier substrate 10 and the dummy layer 20 may be copper clad laminate (CCL). The first seed layer 120s may include a first metal, and the insulating metal oxide layer 110p may be an insulating metal oxide having a second metal different from the first metal. The insulating metal oxide layer 110p may, for example, include aluminum oxide. The first seed layer 120s may, for example, include copper.

According to an exemplary embodiment, the insulating metal oxide layer 110p or the first seed layer 120s may be disposed by using a physical vapor deposition (PVD) method such as a sputtering method. The insulating metal oxide layer 110p may, for example, be disposed to have a thickness of about 5.0 nm. The present inventive concept is not limited thereto. For example, the thickness of the insulating metal oxide layer 110p may be less than about 5.0 nm or greater than about 5.0 nm.

In a case of disposing an insulating metal oxide layer by disposing a metal layer and oxidizing the metal layer, the insulating metal oxide layer has a thickness of 5 nm or greater, even in a case in which natural oxidation occurs. In an exemplary embodiment, to control the thickness of the insulating metal oxide layer 110p to have about 5.0 nm or less, the insulating metal oxide layer 110p may be disposed by using a PVD method including a sputtering method.

As described below, the insulating metal oxide layer 110p and the first seed layer 120s that are disposed on both the top surface 12 and the bottom surface 14 of the carrier substrate 10 may constitute parts of different PCBs, respectively. In other words, the carrier substrate 10 may be used to fabricate two PCBs.

Figure 1B:
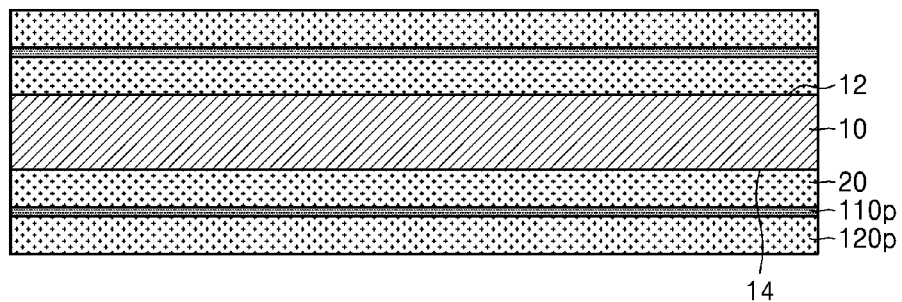

Referring to FIGS. 1A and 1B, a first plating layer 120p may be disposed via a plating operation using the first seed layer 120s as a seed. The first plating layer 120p may be disposed via immersion plating, electroless plating, electroplating, or a combination thereof. The first plating layer 120p may include the same metal as the first metal constituting the first seed layer 120s. The first plating layer 120p may, for example, include copper.

According to an exemplary embodiment, if the insulating metal oxide layer 110p includes a metal insulating oxide having a second metal different from the first metal, the first plating layer 120p may include a third metal different from the first metal and the second metal.

Figure 1C:
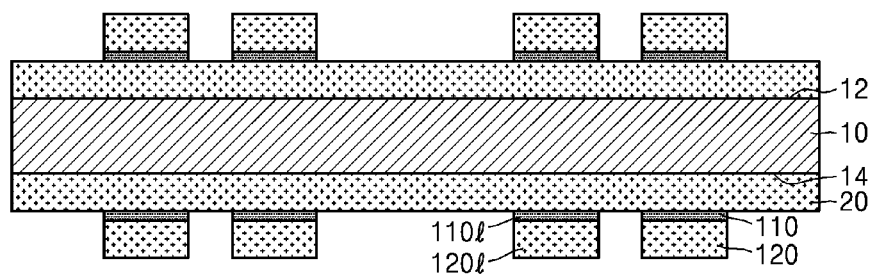

Referring to FIGS. 1B and 1C together, the insulating metal oxide layer 110p and the first plating layer 120p are patterned to dispose insulating metal oxide patterns and first plating patterns.

The first plating patterns include a first connection pad 120 and a first wire 120l. The insulating metal oxide patterns include a first pad cover layer 110 and a wire cover layer 110l. The first connection pad 120 and the first wire 120l constituting each of the first plating patterns are simultaneously disposed by patterning the first plating layer 120p. The first connection pad 120 may serve as a connection pad of a PCB. The first wire 120l may serve as a wire of the PCB. Therefore, the first connection pad 120 and the first wire 120l may include a same material.

Similarly, the first pad cover layer 110 and the wire cover layer 110l constituting the insulating metal oxide patterns are simultaneously disposed by patterning the insulating metal oxide layer 110p. The first pad cover layer 110 covers the first connection pad 120. The wire cover layer 110l covers a top surface of the first wire 120l. Therefore, the first pad cover layer 110 and the wire cover layer 110l may include a same material.

The first pad cover layer 110 and the wire cover layer 110l cover a top surface of the first connection pad 120 and the top surface of the first wire 120l, respectively. A bottom surface of the first pad cover layer 110 and a bottom surface of the wire cover layer 110l are in direct contact with the top surface of the first connection pad 120 and the top surface of the first wire 120l, respectively.

Figure 1D:
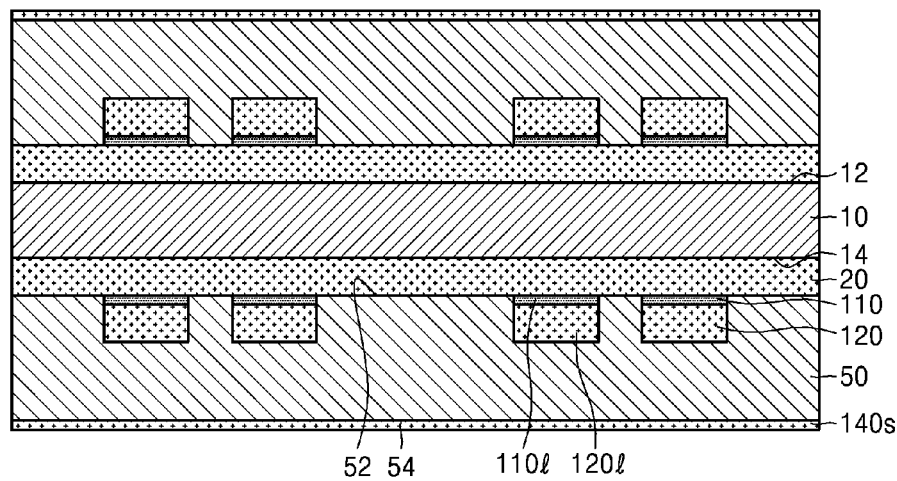

Referring to FIG. 1D, a base substrate layer 50 surrounding the first pad cover layer 110, the wire cover layer 110l, the first connection pad 120 and the first wire 120l, and a second seed layer 140s covering top surfaces of the base substrate layer 50, are disposed on the top surface 12 and the bottom surface 14 of the carrier substrate 10.

The base substrate layer 50 may include an epoxy resin, a polyimide resin, a bismaleimide triazine (BT) resin, flame retardant 4 (FR-4), FR-5, a ceramic, silicon, or glass. However, the present inventive concept is not limited thereto. The base substrate layer 50 may be a single layer or may include a multilayered structure including wire patterns therein. For example, the base substrate layer 50 may be a single rigid flat plate, a plurality of rigid flat plates adhered to one another, or a thin flexible substrate and a rigid flat plate adhered to each other. Each of a plurality of rigid flat plates or flexible substrates adhered to one another may include a wire pattern. The second seed layer 140s may, for example, include copper. A first surface 52 of the base substrate layer 50 faces toward the carrier substrate 10.

According to an exemplary embodiment, the base substrate layer 50 and the second seed layer 140s may be CCL. In this case, the CCL constituting the second seed layer 140s on a second surface 54 of the base substrate layer 50 may be laminated over the carrier substrate 10, such that the first surface 52 of the base substrate layer 50 is attached onto the carrier substrate 10 to face toward the carrier substrate 10.

According to an exemplary embodiment, the base substrate layer 50 may be attached onto the carrier substrate 10 first, and then the second seed layer 140s may be disposed on the second surface 54 of the base substrate layer 50.

A stacked structure of the insulating metal oxide patterns and the first plating patterns is surrounded by the base substrate layer 50 and the dummy layer 20.

Figure 1E:
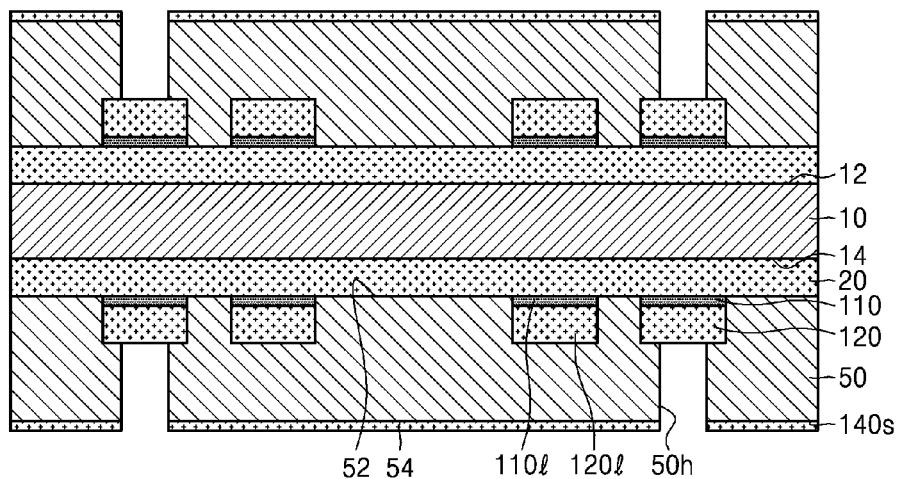

Referring to FIG. 1E, a via hole 50h that penetrates through the base substrate layer 50 and exposes a portion of the first connection pad 120 is formed. The via hole 50h also penetrates through the second seed layer 140s. The first wire 120l is still covered by the base substrate layer 50 having the via hole 50h. Since the second seed layer 140s is located on the second surface 54 of the base substrate layer 50, the via hole 50h penetrates through both the second seed layer 140s and the base substrate layer 50 and expose the portion of the first connection pad 120.

FIG. 1E shows that the via hole 50h exposes only the portion of the first connection pad 120. The present inventive concept is not limited thereto. For example, the via hole 50h exposes a portion of the first wire 120l, or a portion of the first connection pad 120 and a portion of the first wire 120l. For the convenience of description, it is assumed as shown in FIG. 1E that only the portion of the first connection pad 120 is exposed by the via hole 50h.

Figure 1F:
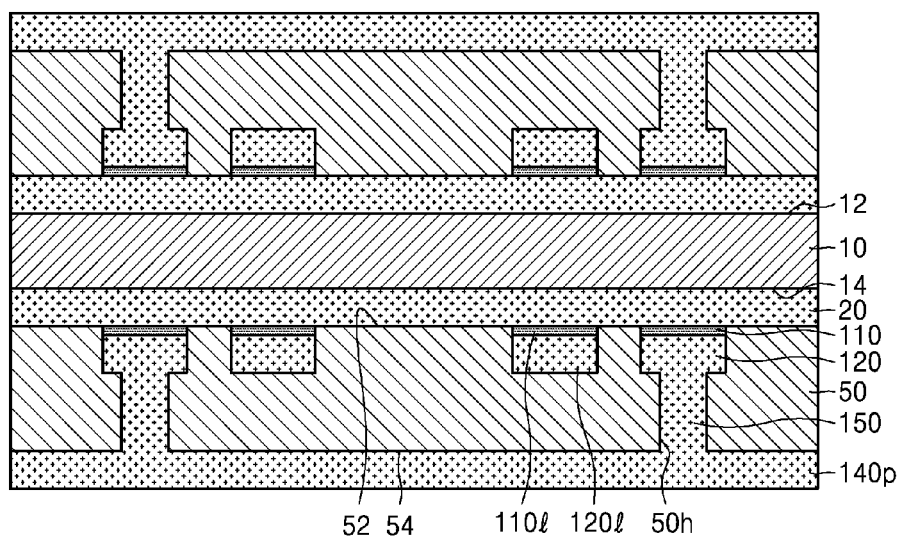

Referring to FIGS. 1E and 1F, a second plating layer 140p and a via wire 150 may be disposed by performing plating using the first connection pad 120 exposed by the via hole 50h as seeds. The second plating layer 140p and the via wire 150 may be, for example, disposed via immersion plating, electroless plating, electroplating, or a combination thereof. The second plating layer 140*p* and the via wire 150 may, for example, include copper.

The second plating layer 140*p* and the via wire 150 may be integrated with each other. The via wire 150 is a portion of the integrated second plating layer 140*p* and via wire 150 that fills the via hole 50*h*, whereas the second plating layer 140*p* is a portion disposed on the second surface 54 of the base substrate layer 50. The via wire 150 is in contact with and electrically connected to the first connection pad 120. Therefore, the second plating layer 140*p* is electrically connected to the first connection pad 120 through the via wire 150.

Figure 1G:
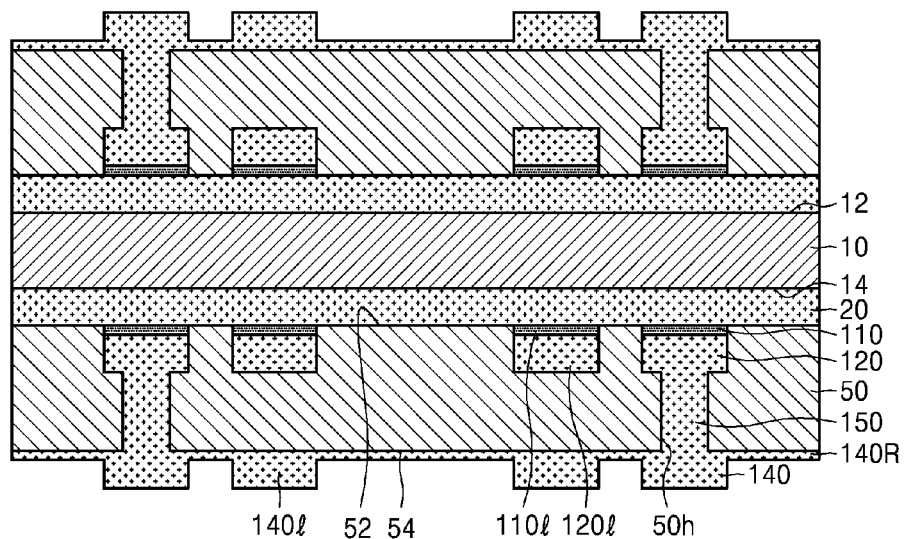

Referring to FIGS. 1F and 1G together, insulating metal second plating patterns are disposed by patterning the second plating layer 140P. The second plating patterns include a second connection pad 140 and a second wire 140*l*. The second connection pad 140 and the second wire 140*l* are simultaneously disposed by patterning the second plating layer 140*p*. The second connection pad 140 may serve as a connection pad of a PCB. The second wire 140*l* may serve as a wire of the PCB. Therefore, the second connection pad 140 and the second wire 140*l* may include a same material.

According to an exemplary embodiment, a residual plating layer 140R, which is a portion of the second plating layer 140*p*, remains on the second surface 54 of the base substrate layer 50 except for a portion of the second surface 54 on which the second plating patterns are disposed. The residual plating layer 140R may serve to protect the second surface 54 of the base substrate layer 50 in later operations. According to an exemplary embodiment, during the operation for disposing the second plating patterns, the residual plating layer 140R may be completely removed to expose a portion of the second surface 54 of the base substrate layer 50. The portion of the second surface 54 is not covered by the second connection pad 140 and the second wire 140*l*.

Figure 1H:
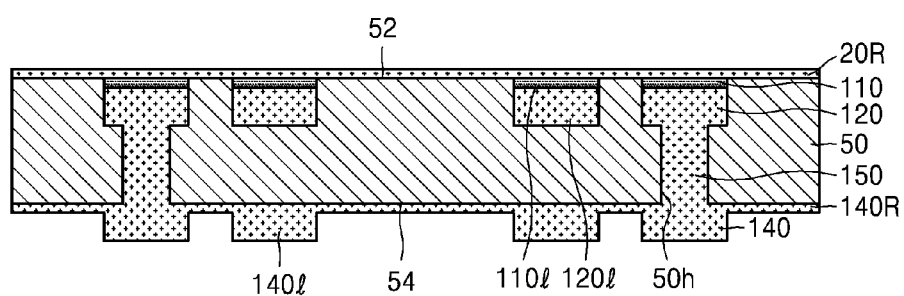

Referring to FIGS. 1G and 1H, the carrier substrate 10 is separated from the base substrate layer 50. During the separation of the carrier substrate 10, a residual dummy layer 20R, which is a portion of the dummy layer 20, remains on the first surface 52 of the base substrate layer 50. The present inventive concept is not limited thereto. For example, in the operation of separating the carrier substrate 10 from the dummy layer 20, the residual dummy layer 20R need not remain on the first surface 52 of the base substrate layer 50, and may be completely removed.

Figure 1I:
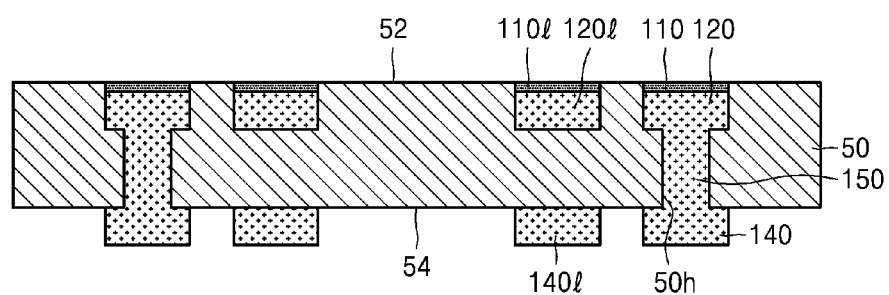

Referring to FIGS. 1H and 1I together, the residual dummy layer 20R and the residual plating layer 140R respectively on the first surface 52 and the second surface 54 of the base substrate layer 50 are removed to the first surface 52 and the second surface 54 of the base substrate layer 50. For example, the second surface 54 of the base substrate layer 50 is partially exposed by the second connection pad 140 and the second wire 140*l*.

The first connection pad 120 and the first wire 120*l* are located at a same level with respect to the second surface 54 of the base substrate layer 50. Furthermore, the first pad cover layer 110 and the wire cover layer 110*l* are located at a same level with respect to the second surface 54 of the base substrate layer 50. The second connection pad 140 and the second wire 140*l* are located at a same level with respect to the first surface 52 of the base substrate layer 50.

According to an exemplary embodiment, at least a portion of the second connection pad 140 overlaps the via wire 150 in a vertical direction. The second wire 140*l* is non-overlapped with the via wire 150 in the vertical direction.

Figure 1J:
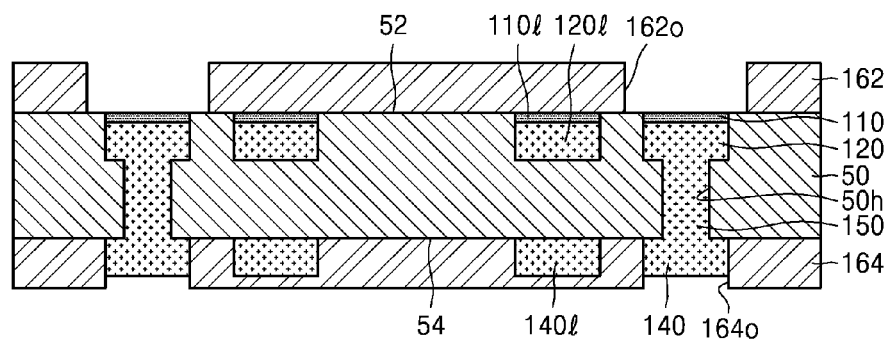

Referring to FIG. 1J, a first solder resist layer 162 and a second solder resist layer 164 are disposed on the first surface 52 and the second surface 54 of the base substrate layer 50, respectively. The first solder resist layer 162 and the second solder resist layer 164 includes a first opening 162*o* and a second opening 164*o* that expose the first pad cover layer 110 and the second connection pad 140 disposed on the first connection pad 120, respectively.

According to an exemplary embodiment, the first solder resist layer 162 and the second solder resist layer 164 may be disposed by applying solder mask insulation ink onto the first surface 52 and the second surface 54 of the base substrate layer 50 via a screen printing method or an inkjet printing method and then curing the solder mask insulation ink using heat, an ultraviolet (UV) ray, or an infrared (IR) ray.

According to some embodiments, the first solder resist layer 162 and the second solder resist layer 164 may be disposed by applying a photo-imageable solder resist entirely on the first surface 52 and the second surface 54 of the base substrate layer 50 using a screen printing or spray coating method or laminating a film-type solder resist material entirely onto the first surface 52 and the second surface 54 of the base substrate layer 50, removing unnecessary portions of the solder resist via exposure and development, and curing the solder resist using heat, a UV ray, or an IR ray.

The first opening 162*o* exposes the entire top surface of the first pad cover layer 110 disposed on the first connection pad 120. The first opening 162*o* further exposes a portion of the first surface 52 of the base substrate layer 50 adjacent to the top surface of the first pad cover layer 110 disposed on the first connection pad 120.

The top surface of the wire cover layer 110*l* disposed on the first wire 120*l* and the top surface of the second wire 140*l* are completely covered by the first solder resist layer 162 and the second solder resist layer 164, respectively.

The present inventive concept is not limited thereto. For example, the first opening 162*o* may expose only a portion of the top surface of the first pad cover layer 110 disposed on the first connection pad 120 without exposing the remainder of the first pad cover layer 110. In this case, the first surface 52 of the base substrate layer 50 is not exposed by the first opening 162*o*. In other words, the first solder resist layer 162 may cover entirely the first surface 52 of the base substrate layer 50 on which the first pad cover layer 110 is not disposed and may also cover the remainder of the top surface of the first pad cover layer 110 not exposed by the first opening 162*o*.

Depending on a pitch of the first connection pad 120, the first opening 162*o* may expose only a portion of the top surface of the first pad cover layer 110, or may expose the entire top surface of the first pad cover layer 110. In the latter case, the first opening may further expose a portion of the first surface 52 of the base substrate layer 50 adjacent to the top surface of the first pad cover layer 110, as shown in FIG. 1J.

Figure 1K:
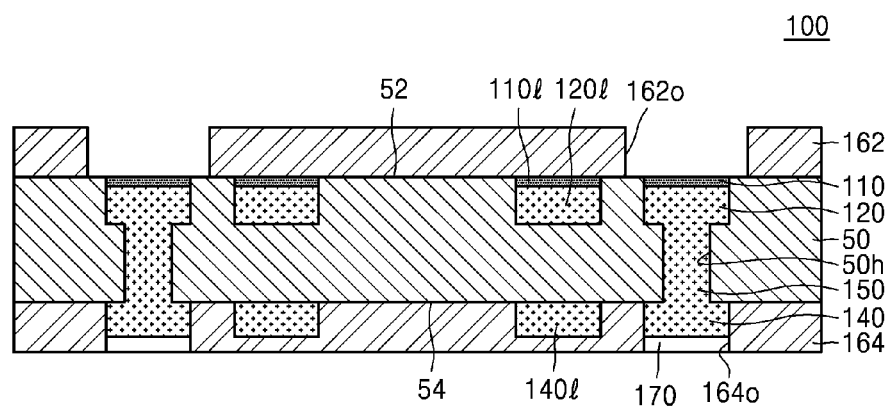

Referring to FIG. 1K, a second pad cover layer 170 is disposed on the top surface of the second connection pad 140 exposed by the second opening 164*o* to form a PCB 100. The second pad cover layer 170 may include a material disposed through, for example, organic solderability preservative (OSP) surface treatment.

For example, if the second connection pad 140 includes copper, the second pad cover layer 170 may include an organic compound, such as benzotriazole, imidazole, and benzimidazole, such that the second pad cover layer 170 is attached to the top surface of the second connection pad 140 and form a chemical bond with copper of the second connection pad 140. The second pad cover layer 170 may prevent an unwanted oxidation reaction or damage to the surface of the second connection pad 140. The second pad cover layer 170 may, for example, have a thickness less than or equal to 0.5 μm.

Figure 1L:
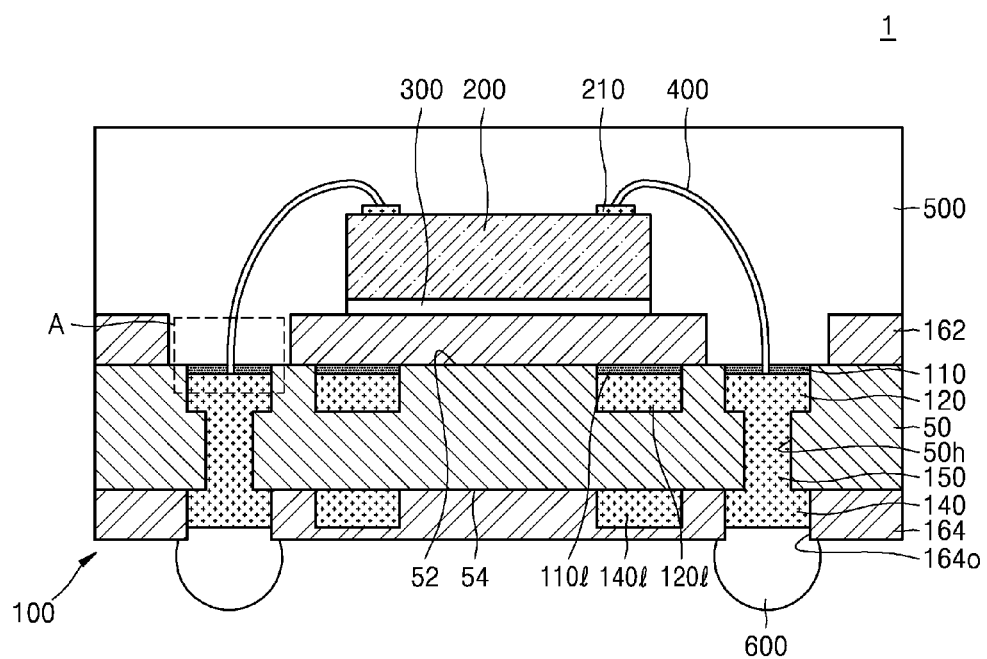
FIG. 1L is a cross-sectional view of a semiconductor package according to an exemplary embodiment of the present inventive concept.

The PCB 100 includes the base substrate layer 50, the first connection pad 120 disposed on the first surface 52 of the base substrate layer 50, and the second connection pad 140 disposed on the second surface 54 of the base substrate layer 50. For example, as shown in FIG. 1L, a bonding wire 400 is connected to the first connection pad 120, and a solder joint 600 is connected to the second connection pad 140.

The first connection pad 120 is embedded in the base substrate layer 50 to form an embedded traces structure (ETS). The second connection pad 140 has a form extended from the second surface 54 of the base substrate layer 50. For example, the second connection pad 140 is not embedded in the base substrate layer 50.

The PCB 100 further includes the first wire 120l disposed on the first surface 52 of the base substrate layer 50 and the second wire 140l disposed on the second surface 54. The first connection pad 120 and the second connection pad 140 are electrically connected to each other via the via wire 150 disposed in the base substrate layer 50.

Although FIG. 1K shows that the PCB 100 includes two layers respectively consisting of the first wire 120l and the second wire 140l disposed on both the first surface 52 and the second surface 54, the inventive concept is not limited thereto. For example, the PCB 100 may include at least three layers including an internal wire that constitutes at least one layer in the base substrate layer 50. Throughout the present specification, wires arranged at a same level on both the first surface 52 and the second surface 54 of the PCB 100 or in the PCB 100 constitute a single layer, whereas wires arranged at different layers may be electrically connected to one another via a via wire.

FIG. 1K shows that the first connection pad 120 and the second connection pad 140 are directly connected to each other via the via wire 150. The inventive concept, however, is not limited thereto. For example, the first connection pad 120 and the second connection pad 140 are electrically connected to each other via at least one of the first wire 120l, the internal wire, and the second wire 140l, and at least one of the via wire 150. The first pad cover layer 110 and the second pad cover layer 170 are disposed on the top surfaces of the first connection pad 120 and the second connection pad 140, respectively. The wire cover layer 110l is disposed on the first wire 120l.

The first solder resist layer 162 and the second solder resist layer 164 are disposed on the first surface 52 and the second surface 54 of the base substrate layer 50, respectively. The first solder resist layer 162 includes the first opening 162o exposing the first pad cover layer 110 disposed on the first connection pad 120. The first solder resist layer 162 completely covers the top surface of the wire cover layer 110l disposed on the first wire 120l. The second solder resist layer 164 includes the second opening 164o exposing the second pad cover layer 170 disposed on the second connection pad 140. The second solder resist layer 164 completely covers the top surface of the second wire 140l. The first solder resist layer 162 is not in direct contact with the first wire 120l and is in direct contact the top surface of the wire cover layer 110l. The second solder resist layer 164 is in direct contact with the top surface of the second wire 140l.

The first pad cover layer 110 completely covers the top surface of the first connection pad 120. The second pad cover layer 170 completely covers the top surface of the second connection pad 140. In an exemplary embodiment, the second pad cover layer 170 may cover a portion of the top surface of the second connection pad 140 that is not covered by the second solder resist layer 164.

The first pad cover layer 110 and the second pad cover layer 170 may include different materials.

For example, the first pad cover layer 110 may include an insulating metal oxide, such as aluminum oxide, and the second pad cover layer 170 may include an organic compound disposed through OSP surface treatment.

The first pad cover layer 110 and the wire cover layer 110l may include a same material. If the first connection pad 120 and the first wire 120l include a first metal such as copper, the first pad cover layer 110 and the wire cover layer 110l may include an insulating metal oxide having a second metal different from the first metal.

According to an exemplary embodiment, each of the first pad cover layer 110 and the wire cover layer 110l may have a thickness equal to or greater than 0.5 nm and less than 5 nm. According to an exemplary embodiment, the second pad cover layer 170 has a thickness less than or equal to 0.5 μm and greater than the thickness of the first pad cover layer 110 and the thickness of the wire cover layer 110l.

FIG. 1L is a cross-sectional view of a semiconductor package according to an exemplary embodiment of the present inventive concept.

Referring to FIG. 1L, a semiconductor package 1 includes the PCB 100 and a semiconductor chip 200. Since the PCB 100 is described above in detail with reference to FIG. 1K, further detailed descriptions thereof will be omitted.

The semiconductor chip 200 may be, for example, a memory semiconductor chip. The memory semiconductor chip may be a volatile memory semiconductor chip, such as a dynamic random-access memory (DRAM) and a static random-access memory (SRAM), or a non-volatile memory semiconductor chip, such as a phase-change random-access memory (PRAM), a magnetoresistive random-access memory (MRAM), a ferroelectric random-access memory (FeRAM), and a resistive random-access memory (RRAM). The present inventive concept is not limited thereto. For example, the semiconductor chip 200 may be a logic semiconductor chip, such as a central processing unit (CPU or MPU) or an application processor (AP).

Figure 1M:
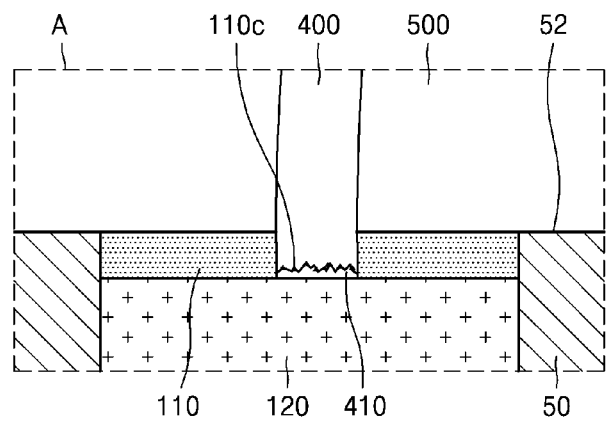
FIG. 1M is an enlarged cross-sectional view of a portion of a semiconductor package according to an exemplary embodiment of the present inventive concept.

The semiconductor chip 200 is mounted on a top surface of the PCB 100. For example, the semiconductor chip 200 is mounted on the PCB 100 such that a bottom surface of the semiconductor chip 200 faces toward the PCB 100. In this case, a die adhesive film 300 is interposed between the semiconductor chip 200 and the PCB 100. A chip pad 210 is disposed on a top surface of the semiconductor chip 200. The chip pad 210 of the semiconductor chip 200 and the first connection pad 120 of the PCB 100 are electrically connected to each other via the bonding wire 400. A first end of the bonding wire 400 is connected to the chip pad 210 of the semiconductor chip 200, whereas a second end of the bonding wire 400 is connected to the first connection pad 120 of the PCB 100. The second end of the bonding wire 400 penetrates through the first pad cover layer 110 to be connected to the first connection pad 120. A first intermetallic compound 410 of FIG. 1M is disposed between the first connection pad 120 and the bonding wire 400. Fragments 110c of FIG. 1M are also located at the interface between the second end of the bonding wire 400 and the first intermetallic compound 410. The fragments 110c may be portions of the first pad cover layer 110 formed in the process in which the bonding wire 400 penetrates through the first pad cover layer 110. Detailed description thereof will be provided below with reference to FIG. 1M.

The solder joint 600 is attached to the second connection pad 140. The solder joint 600 may, for example, be a solder ball or a solder bump. If the second pad cover layer 170 disposed on the second connection pad 140 includes an organic compound, the second pad cover layer 170 may be removed during a reflow operation for disposing the solder joint 600. In this case, a second intermetallic compound (not shown) may be formed between the second connection pad 140 and the solder joint 600. If the second connection pad 140 includes copper (Cu) and the solder joint 600 includes tin (Sn), the second intermetallic compound may be, for example, a compound including copper and tin.

A mold layer 500 covering the top surface of the PCB 100 and surrounding the semiconductor chip 200 and the bonding wire 400 is disposed on the top surface of the PCB 100. The mold layer 500 may, for example, include an epoxy mold compound (EMC).

The semiconductor package 1 according to an exemplary embodiment may be fabricated by using the PCB 100 including the first pad cover layer 110 covering the top surface of the first connection pad 120 and the second pad cover layer 170 covering the top surface of the second connection pad 140. Since the first pad cover layer 110 is disposed using a PVD method instead of an oxidation method, the first pad cover layer 110 may have a relatively small thickness. Furthermore, since the first connection pad 120 includes a first metal, and the first pad cover layer 110 includes an insulating metal oxide having a second metal different from the first metal, no additional natural oxidation occurs at the first pad cover layer 110, and thus the first pad cover layer 110 may maintain a relatively small thickness.

Therefore, the first connection pad 120 may be protected from oxidation or contamination by the first pad cover layer 110, and the bonding wire 400 penetrates through the first pad cover layer 110 and is connected to the first connection pad 120. Thus, an interconnection between the bonding wire 400 and the first connection pad 120 may be reliable.

FIG. 1M is an enlarged cross-sectional view of a portion of a semiconductor package according to an exemplary embodiment of the present inventive concept. More specifically, FIG. 1M is an enlarged cross-sectional view of A of FIG. 1L.

Referring to FIG. 1M, the bonding wire 400 is connected to the first connection pad 120 via the first intermetallic compound 410. If the bonding wire 400 includes gold (Au) and the first connection pad 120 includes copper (Cu), the first intermetallic compound 410 may be a compound including gold and copper.

The bonding wire 400 penetrates through the first pad cover layer 110 to be connected to the first connection pad 120. Therefore, the first intermetallic compound 410 may be disposed on a portion of the top surface of the first connection pad 120 connected to bonding wire 400, whereas the remaining portion of the top surface of the first connection pad 120 may be covered by the first pad cover layer 110. At the interface between the first intermetallic compound 410 and the bonding wire 400, the fragments 110c of the first pad cover layer 110 may be formed while the bonding wire 400 penetrates through the first pad cover layer 110.

When the bonding wire 400 is connected to the top surface of the first connection pad 120, the second end of the bonding wire 400 may break the first pad cover layer 110 and the fragments 110c may be formed. For example, metal atoms constituting the bonding wire 400 may diffuse from the second end of the bonding wire 400 to the first connection pad 120, thereby forming the first intermetallic compound 410. Therefore, the fragments 110c are arranged at the interface between first intermetallic compound 410 and bonding wire 400. Furthermore, the fragments 110c may include the same material as the first pad cover layer 110.

For example, if the first connection pad 120 includes a first metal, if the first pad cover layer 110 includes an insulating metal oxide having a second metal different from the first metal, and if the bonding wire 400 includes a third metal different from the first metal, the first intermetallic compound 410 may include a compound of the first metal and the third metal, and the fragments 110c may include an insulating metal oxide having the second metal.

Referring back to FIG. 1L, the top surface of the first wire 120l is in direct contact with the wire cover layer 110l and is completely covered by the wire cover layer 110l. The wire cover layer 110l may, for example, include an insulating metal oxide having the second metal.

On the contrary, the top surface of the second wire 140l is in direct contact with the second solder resist layer 164 and is completely covered by the second solder resist layer 164.

FIGS. 2A through 2G are cross-sectional diagrams showing a method of manufacturing a PCB, according to an exemplary embodiment of the present inventive concept.

Figure 2A:
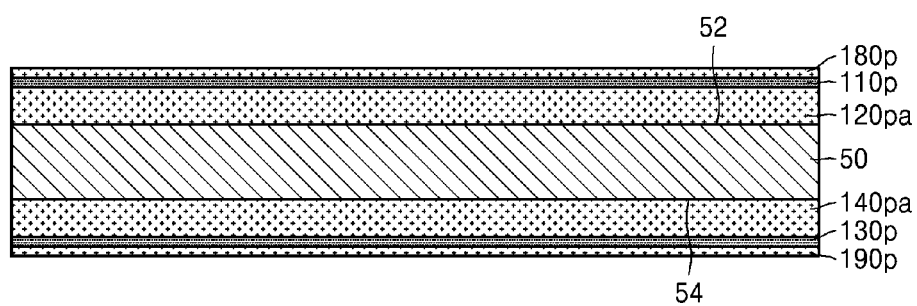
FIGS. 2A through 2G are cross-sectional diagrams showing a method of manufacturing a PCB, according to an exemplary embodiment of the present inventive concept.

Referring to FIG. 2A, the base substrate layer 50 having a first metal layer 120pa and a second metal layer 140pa respectively disposed on the first surface 52 and the second surface 54 of the base substrate layer 50 is prepared. The first metal layer 120pa and the second metal layer 140pa may include a first metal. For example, the first metal layer 120pa and the second metal layer 140pa may include copper layers. For example, the first metal layer 120pa and the second metal layer 140pa may include electrolytically deposited (ED) copper foils, rolled-annealed copper foils, ultra-thin copper foils, sputtered copper, or copper alloys.

According to an exemplary embodiment, the base substrate layer 50, the first metal layer 120pa and the second metal layer 140pa respectively disposed on the first surface 52 and the second surface 54 of the base substrate layer 50 may be CCL. According to an exemplary embodiment, the first metal layer 120pa and the second metal layer 140pa may be plated layers disposed by performing plating using seed layers arranged on each of the first surface 52 and the second surface 54 of the base substrate layer 50. In this case, the base substrate layer 50 and the seed layers disposed on each of the first surface 52 and the second surface 54 of the base substrate layer 50 may be CCL.

The first insulating metal oxide layer 110p and a first metal protection layer 180p are stacked on the first metal layer 120pa, whereas a second insulating metal oxide layer 130p and a second metal protection layer 190p are stacked on the second metal layer 140pa. The first insulating metal oxide layer 110p and the second insulating metal oxide layer 130p may include an insulating metal oxide having a second metal different from the first metal. The first insulating metal oxide layer 110p and the second insulating metal oxide layer 130p may, for example, include an aluminum oxide. The first metal protection layer 180p and the second metal protection layer 190p may, for example, include the first metal.

According to an exemplary embodiment, the first insulating metal oxide layer 110p, the second insulating metal oxide layer 130p, the first metal protection layer 180p or the second metal protection layer 190p may be disposed by using a PVD method, such as a sputtering method. The first insulating metal oxide layer 110p may, for example, be disposed such that it has a thickness equal to or greater than 0.5 nm and less than 5 nm. The second insulating metal oxide layer 130p may, for example, be disposed such that it has a thickness equal to or greater than 0.5 nm and less than or equal to 100 nm.

The first metal layer 120pa, the first insulating metal oxide layer 110p, and the first metal protection layer 180p are symmetrically arranged with the second metal layer 140pa, the second insulating metal oxide layer 130p, and the second metal protection layer 190p with respect to the base substrate layer 50.

Figure 2B:
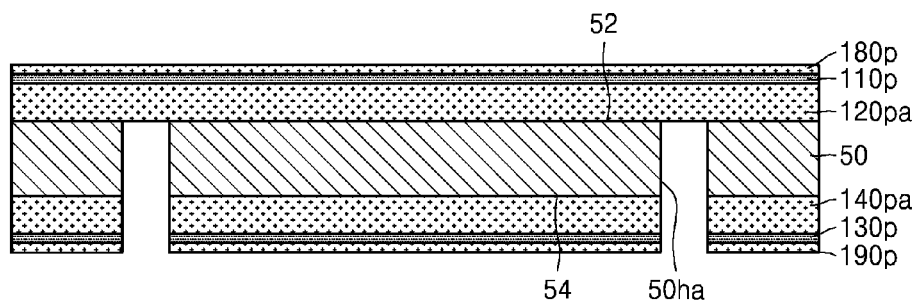

Referring to FIG. 2B, a via hole 50ha is formed such that it penetrates through the second metal protection layer 190p, the second insulating metal oxide layer 130p, the second metal layer 140pa, and the base substrate layer 50 and exposes a portion of the first metal layer 120pa.

According to an exemplary embodiment, the via hole 50ha may be formed such that it penetrates through the first metal protection layer 180p, the first insulating metal oxide layer 110p, the first metal layer 120pa, and the base substrate layer 50 and exposes a portion of the second metal layer 140pa.

Figure 2C:
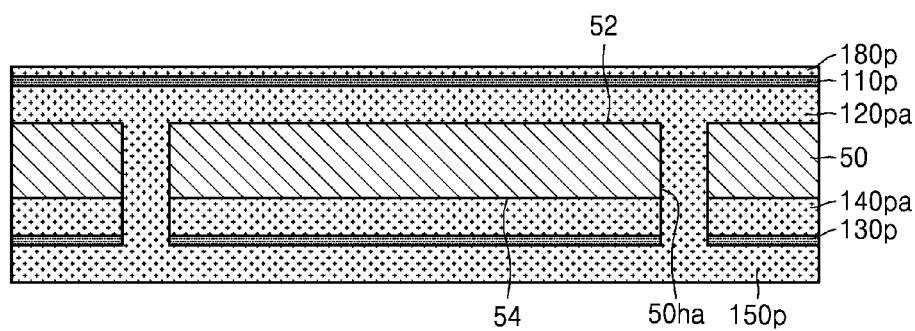

Referring to FIGS. 2B and 2C together, a via layer 150p is disposed by performing plating using the second metal protection layer 190p and a portion of the first metal layer 120pa exposed by the via hole 50ha as seeds. The via layer 150p fills the via hole 50ha, covering the second insulating metal oxide layer 130p. The via layer 150p may, for example, include copper. In this case, the second metal protection layer 190p is integrated into the via layer 150p.

Figure 2D:
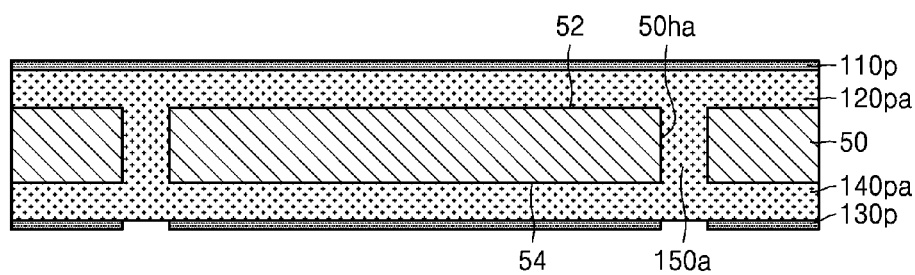

Referring to FIGS. 2C and 2D, a portion of the via layer 150p covering the second insulating metal oxide layer 130p is removed, thereby forming a via wire 150a. In the operation for removing the via layer 150p to dispose the via wire 150a, the first metal protection layer 180p is also be removed. Therefore, top surfaces of the first insulating metal oxide layer 110p and the second insulating metal oxide layer 130p are exposed.

Throughout the present specification, a portion of the via layer 150p which remains at the same level as the second metal layer 140pa of FIG. 2C is considered to be a portion of the second metal layer 140pa for convenience of explanation, and a portion of the via layer 150p which fills the via hole 50ha is referred to as the via wire 150a.

Figure 2E:
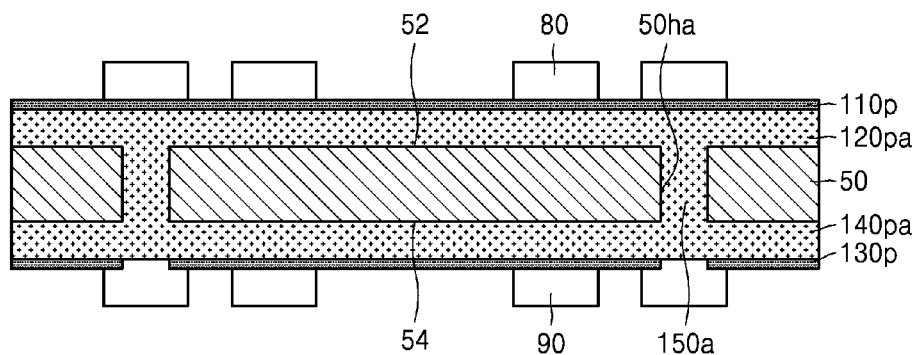

Referring to FIG. 2E, a first mask layer 80 and a second mask layer 90 are disposed to respectively cover portions of the top surfaces of the first insulating metal oxide layer 110p and the second insulating metal oxide layer 130p.

The second mask layer 90 also covers a portion of the second metal layer 140pa that is not covered by the second insulating metal oxide layer 130p. The inventive concept, however, is not limited thereto. For example, at least some of a plurality of second mask layers 90 may cover only portions of the second insulating metal oxide layer 130p without covering the portion of the second metal layer 140pa. Detailed description thereof will be provided below with reference to FIGS. 4A through 4D.

Figure 2F:
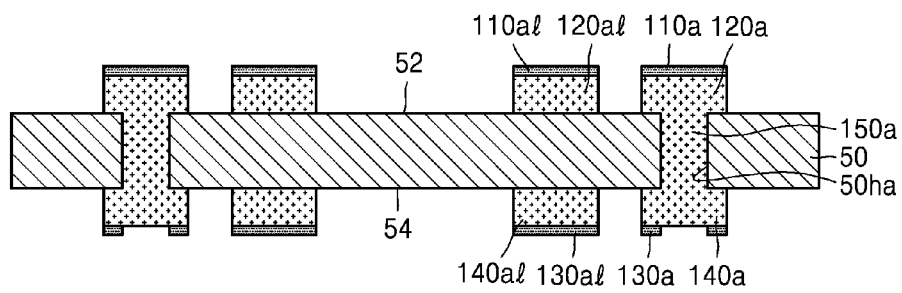

Referring to FIGS. 2E and 2F together, the first insulating metal oxide layer 110p and the first metal layer 120pa are patterned by using the first mask layer 80 as an etching mask, thereby disposing first insulating metal oxide patterns and first metal patterns.

The first metal patterns include a first connection pad 120a and a first wire 120a1. The first insulating metal oxide patterns include a first pad cover layer 110a and a first wire cover layer 110a1. The first pad cover layer 110a covers an entire top surface of the first connection pad 120a. The first wire cover layer 110a1 covers an entire top surface of the first wire 120a1.

Similarly, by using the second mask layer 90 as an etching mask, the second insulating metal oxide layer 130p and the second metal layer 140pa are patterned, thereby forming second insulating metal oxide patterns and second metal patterns.

The second metal patterns include a second connection pad 140a and a second wire 140a1. The second insulating metal oxide patterns include a second pad cover layer 130a and a second wire cover layer 130a1. The second connection pad 140a and the second wire 140a1 may include a same material. The second pad cover layer 130a and the second wire cover layer 130a1 may include a same material.

At least a portion of the second connection pad 140a overlaps the via wire 150a in a vertical direction. The second wire 140a1 is non-overlapped with the via wire 150a in the vertical direction.

The second pad cover layer 130a covers a top surface of the second connection pad 140a. The second wire cover layer 130a1 covers a top surface of the second wire 140a1. For example, the second pad cover layer 130a covers only a portion of the top surface of the second connection pad 140a that does not overlap the via wire 150a in a vertical direction without covering a portion of the second connection pad 140a that overlaps the via wire 150a in the vertical direction. According to an exemplary embodiment, the second wire cover layer 130a1 may cover only a portion of the top surface of the second wire 140a1.

Figure 2G:
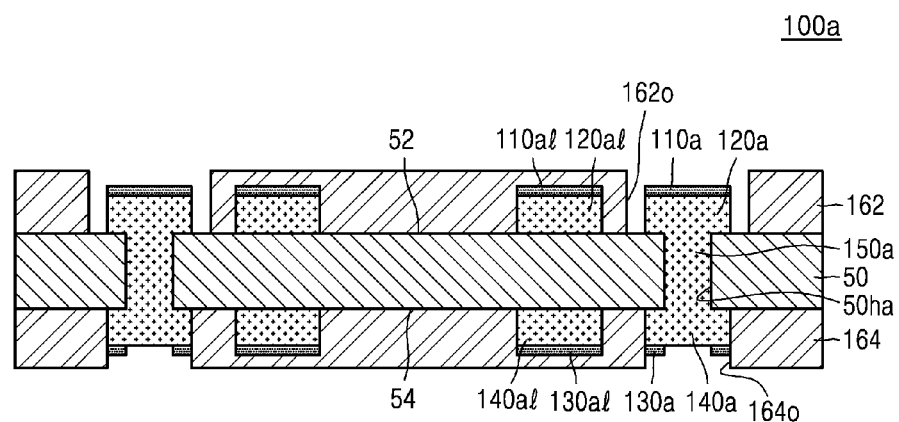

Referring to FIG. 2G, the first solder resist layer 162 and the second solder resist layer 164 are respectively disposed on the first surface 52 and the second surface 54 of the base substrate layer 50, thereby forming a PCB 100a. The first solder resist layer 162 and the second solder resist layer 164 include the first opening 162o and the second opening 164o exposing the first pad cover layer 110a disposed on the first connection pad 120a and the second pad cover layer 130a disposed on the second connection pad 140a, respectively.

The first connection pad 120a and the second connection pad 140a are formed to protrude from the first surface 52 and the second surface 54 of the base substrate layer 50, respectively.

Figure 2H:
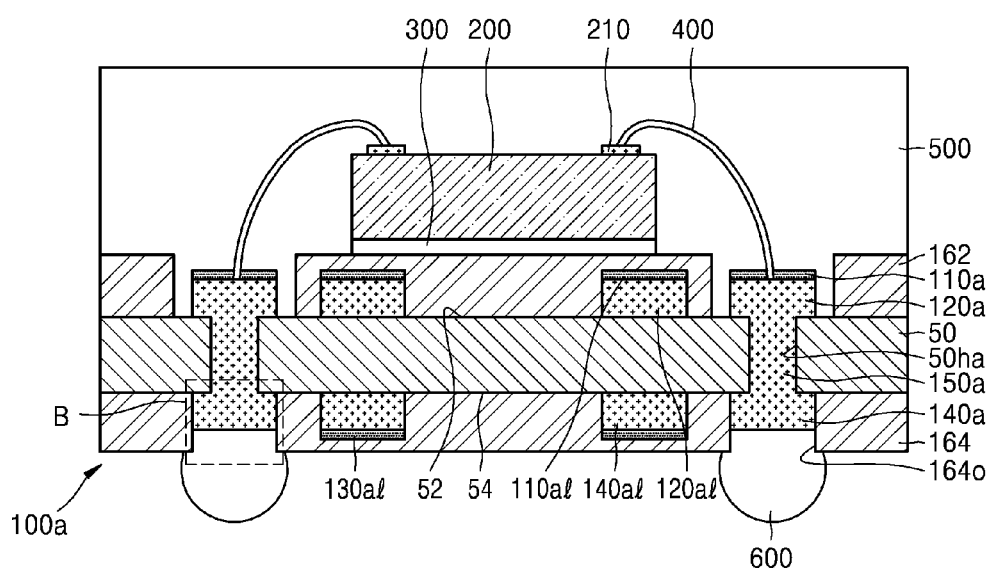
FIG. 2H is a cross-sectional view of a semiconductor package according to an exemplary embodiment of the present inventive concept.

FIG. 2H is a cross-sectional view of a semiconductor package according to an exemplary embodiment of the present inventive concept.

Referring to FIG. 2H, a semiconductor package 2 includes the PCB 100a and the semiconductor chip 200. Since the PCB 100a is described above in detail with reference to FIG. 2G, further detailed descriptions thereof will be omitted.

The semiconductor chip 200 may be mounted on the top surface of the PCB 100a via the die adhesive film 300. The chip pad 210 of the semiconductor chip 200 and the first connection pad 120a of the PCB 100a are electrically connected to each other via the bonding wire 400. A first end of the bonding wire 400 is connected to the chip pad 210 of the semiconductor chip 200, whereas a second end is connected to the first connection pad 120a of the PCB 100a. The second end of the bonding wire 400 penetrates through the first pad cover layer 110a and is connected to the first connection pad 120a. A first intermetallic compound may be formed between the first connection pad 120a and the bonding wire 400. Furthermore, first fragments may also be located at the interface between the bonding wire 400 and the first intermetallic compound. The first fragments may be portions of the first pad cover layer 110a formed when the bonding wire 400 penetrates through the first pad cover layer 110a. The first pad cover layer 110a, the first fragments, and the first intermetallic compound are substantially identical to the first pad cover layer 110, the fragments 110c, and the first intermetallic compound 410 of FIG. 1M, and thus detailed descriptions thereof will be omitted.

Figure 2I:
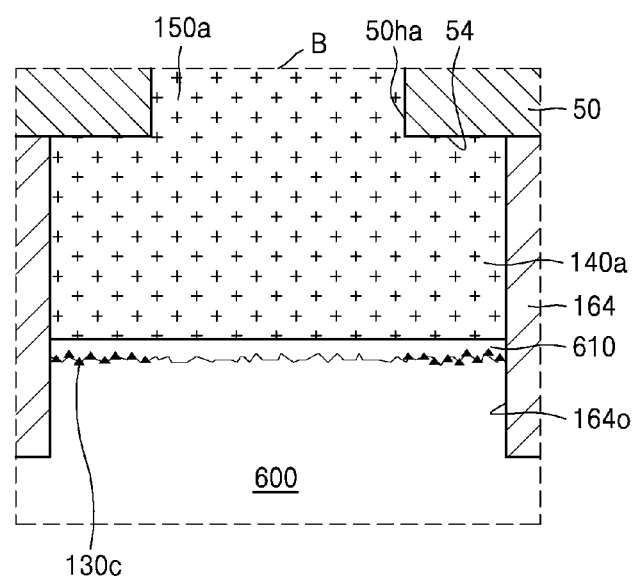
FIG. 2I is an enlarged cross-sectional view of a portion of a semiconductor package according to an exemplary embodiment of the present inventive concept.

The solder joint 600 is attached onto the second connection pad 140a. A second intermetallic compound (610 of FIG. 2I) is formed between the second connection pad 140a and the solder joint 600. Second fragments 130c of FIG. 2I are arranged at the interface between the solder joint 600 and the second intermetallic compound 610. The second fragments 130c may be broken portions of the second pad cover layer 130a formed while the solder joint 600 is being attached onto the second connection pad 140a. A detailed description thereof will be provided below with reference to FIG. 2I.

The mold layer 500 covering the top surface of the PCB 100a and surrounding the semiconductor chip 200 and the bonding wire 400 is disposed on the top surface of the PCB 100a.

The semiconductor package 2 is fabricated by using the PCB 100a including the first pad cover layer 110a covering the top surface of the first connection pad 120a and the second pad cover layer 130a covering the top surface of the second connection pad 140a. If the first pad cover layer 110a and the second pad cover layer 130a are disposed by using a PVD method instead of an oxidation method, the first pad cover layer 110a and the second pad cover layer 130a may have relatively small thicknesses. Therefore, the top surfaces of the first connection pad 120a and the second connection pad 140a may be protected by the first pad cover layer 110a and the second pad cover layer 130a, respectively. The bonding wire 400 penetrates through the first pad cover layer 110a and is connected to the first connection pad 120a. The solder joint 600 breaks the second pad cover layer 130a and is connected to the second connection pad 140a. Thus, interconnections between the bonding wire 400 and the first connection pad 120a and between the solder joint 600 and the second connection pad 140a may be reliable.

FIG. 2I is an enlarged cross-sectional view of a portion of a semiconductor package according to an exemplary embodiment. FIG. 2I is an enlarged cross-sectional view showing B of FIG. 2H.

Referring to FIG. 2I, the solder joint 600 is connected to the second connection pad 140a via the second intermetallic compound 610. If the solder joint 600 includes tin (Sn) and the second connection pad 140a includes copper (Cu), the second intermetallic compound 610 may be a compound including copper and tin.

Portions of a second pad cover layer (130a in FIG. 2G) may be broken during a thermocompression operation or a reflow operation for connecting the solder joint 600 to the second connection pad 140a or may be broken down by solder flux. As a result, the second fragments 130c are formed and the metal atoms constituting the solder joint 600 may diffuse to the second connection pad 140a, and thus the second intermetallic compound 610 may be formed. Therefore, the second fragments 130c are arranged at the interface between the second intermetallic compound 610 and the solder joint 600. The second fragments 130c may include the same material as the second pad cover layer 130a.

For example, if the second connection pad 140a includes a first metal, if the second pad cover layer 130a includes an insulating metal oxide having a second metal different from the first metal, and if the solder joint 600 includes a fourth metal, the second intermetallic compound 610 may include a compound of the first metal and the fourth metal, and the second fragments 130c may include an insulating metal oxide having the second metal.

As shown in FIG. 2G, if the second pad cover layer 130a covers only a portion of the second connection pad 140a, the second fragments 130c may be disposed only at a portion of the interface between the second intermetallic compound 610 and the solder joint 600. For example, the second fragments 130c need not be disposed at an inner portion of the interface between the second intermetallic compound 610 and the solder joint 600 and may be disposed only at an outer portion surrounding the inner portion. For example, the second fragments 130c need not be disposed at a portion of the interface between the second intermetallic compound 610 and the solder joint 600 that overlaps the via wire 150a in a vertical direction and may be disposed only at a portion that does not overlap the via wire 150a in the vertical direction.

Referring back to FIG. 2H, the top surface of the second wire 140a1 is in direct contact with the second wire cover layer 130a1 and covered by the second wire cover layer 130a1.

Figure 3A:
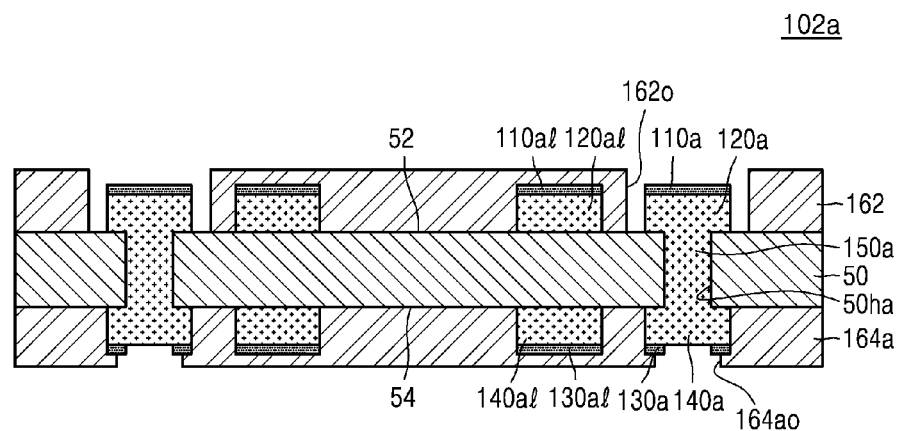
FIG. 3A is a cross-sectional view of a PCB according to an exemplary embodiment of the present inventive concept.

FIG. 3A is a cross-sectional view of a PCB according to an exemplary embodiment. Descriptions of FIG. 3A that are identical to the descriptions already provided above with reference to FIG. 2G will be omitted.

Referring to FIG. 3A, a PCB 102a includes the base substrate layer 50, the first solder resist layer 162 having the first opening 162o, and a second solder resist layer 164a having a second opening 164ao. The second solder resist layer 164a covers at least a portion of the second pad cover layer 130a.

The second opening 164ao exposes a portion of the top surface of the second pad cover layer 130a without exposing the remaining portion of the top surface of the second pad cover layer 130a. In other words, the second solder resist layer 164a need not cover a portion of the top surface of the second pad cover layer 130a, covering the remaining portion of the top surface of the second pad cover layer 130a that is not exposed by the second opening 164o. Furthermore, the second solder resist layer 164a covers the entire top surface of the second wire cover layer 130a1.

Figure 3B:
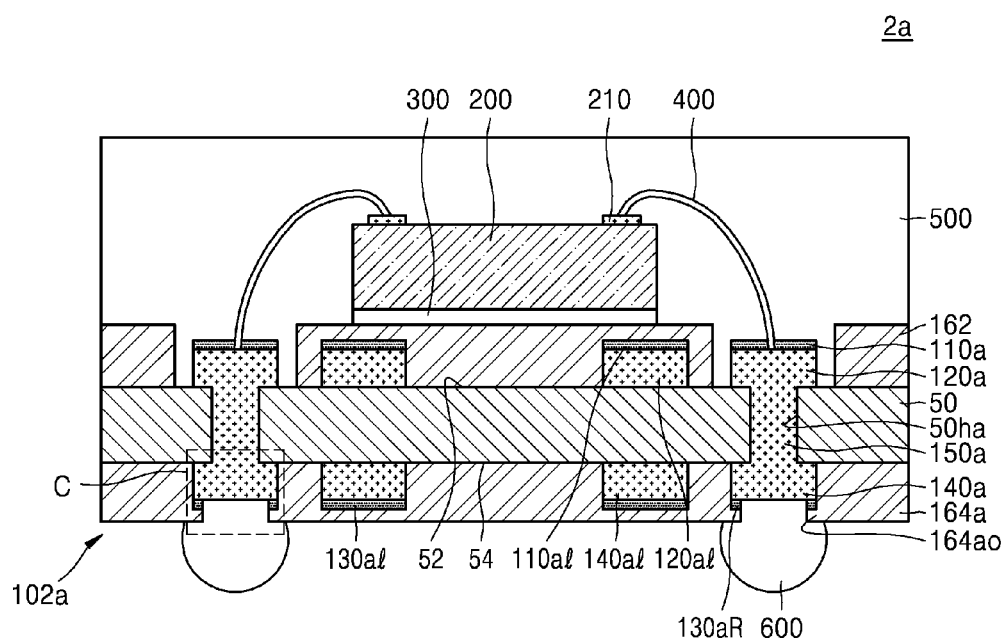
FIG. 3B is a cross-sectional view of a semiconductor package according to an exemplary embodiment of the present inventive concept.

FIG. 3B is a cross-sectional view of a semiconductor package according to an exemplary embodiment. Descriptions of FIG. 3B identical to the descriptions already provided above with reference to FIG. 2H will be omitted.

Referring to FIG. 3B, a semiconductor package 2a includes the PCB 102a and the semiconductor chip 200. Since the PCB 102a is described above in detail with reference to FIGS. 2G and 3A, detailed descriptions thereof will be omitted.

Figure 3C:
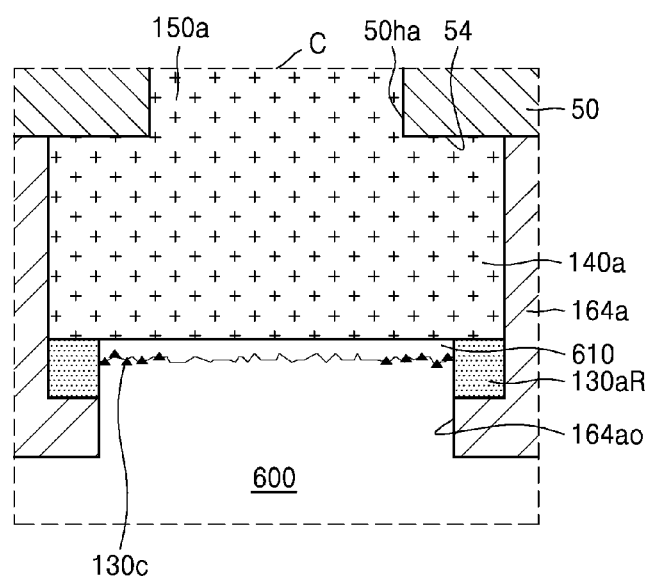
FIG. 3C is an enlarged cross-sectional view of a portion of a semiconductor package according to an exemplary embodiment of the present inventive concept.

The solder joint 600 is attached onto the second connection pad 140a. A second intermetallic compound 610 of FIG. 3C is formed between the second connection pad 140a and the solder joint 600. Furthermore, the second fragments 130c of FIG. 3C are arranged at the interface between the solder joint 600 and the second intermetallic compound 610.

FIG. 3C is an enlarged cross-sectional view of a portion of a semiconductor package according to an exemplary embodiment. FIG. 3C is an enlarged cross-sectional view showing C of FIG. 3B. Descriptions of FIG. 3C identical to the descriptions already provided above with reference to FIG. 2I will be omitted.

Referring to FIG. 3C, the solder joint 600 is connected to the second connection pad 140a via the second intermetallic compound 610.

As shown in FIG. 3B, if the second solder resist layer 164a covers at least a portion of the second pad cover layer 130a, a portion 130aR of the second pad cover layer 130a remains between the second solder resist layer 164a and the second connection pad 140a. In other words, the second solder resist layer 164a covers a top surface of the portion 130aR of the second pad cover layer 130a. The second fragments 130c, which are formed from a portion of the second pad cover layer 130a exposed by the second opening 164ao and broken in FIG. 3B, may be arranged, unlike FIG. 3C, only at a portion of the interface between the second intermetallic compound 610 and the solder joint 600. For example, the second fragments 130c need not be disposed at a portion of the interface between the second intermetallic compound 610 and the solder joint 600 that overlaps the via wire 150a in a vertical direction and are disposed only at a portion of the interface that does not overlap the via wire 150a in the vertical direction.

Figure 4A:
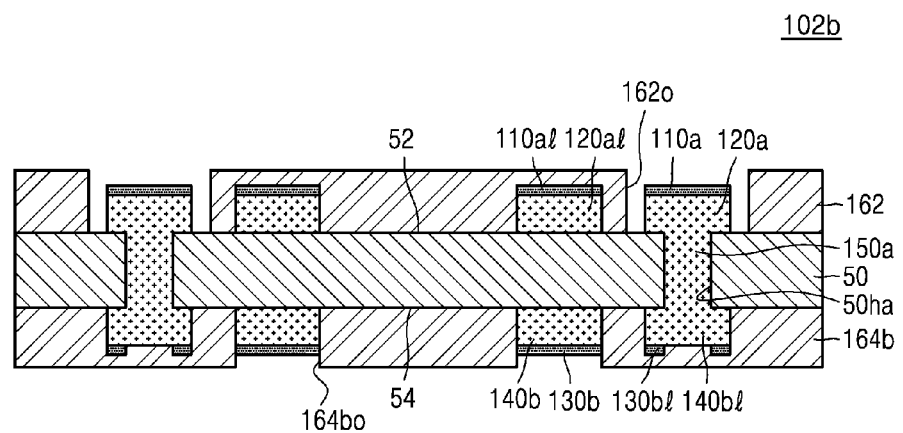
FIG. 4A is a cross-sectional view of a PCB according to an exemplary embodiment of the present inventive concept.

FIG. 4A is a cross-sectional view of a PCB according to an exemplary embodiment. Descriptions of FIG. 4A identical to the descriptions already provided above with reference to FIGS. 2G and 3A will be omitted.

Referring to FIG. 4A, a PCB 102b includes the base substrate layer 50, the first solder resist layer 162 having the first opening 162o, and a second solder resist layer 164b having a second opening 164bo.

A second connection pad 140b need not overlap the via wire 150a in a vertical direction, and a second wire 140b1 overlaps the via wire 150a in a vertical direction. A second pad cover layer 130b covers the entire top surface of the second connection pad 140b, and a second wire cover layer 130b1 may cover only a portion of the top surface of the second wire 140b1. For example, the second wire cover layer 130b1 covers only a portion of the top surface of the second wire 140b1 that does not overlap the via wire 150a in a vertical direction without covering a portion of the top surface of the second wire 140b1 that overlaps the via wire 150a in the vertical direction.

In an exemplary embodiment, the second connection pad 140b may be electrically connected to the via wire 150a via the second wire 140b1 extending along the second surface 54 of the base substrate layer 50.

In an exemplary embodiment, a PCB including both the second connection pad 140a, which overlaps the via wire 150a in a vertical direction as shown in FIG. 2G, and the second connection pad 140b, which does not overlap the via wire 150a in a vertical direction as shown in FIG. 4A, or a PCB including both the second wire 140a1, which does not overlap the via wire 150a in a vertical direction as shown in FIG. 2G, and the second wire 140b1, which overlaps the via wire 150a in a vertical direction as shown in FIG. 4A, may also be included in the present inventive concept.

Figure 4B:
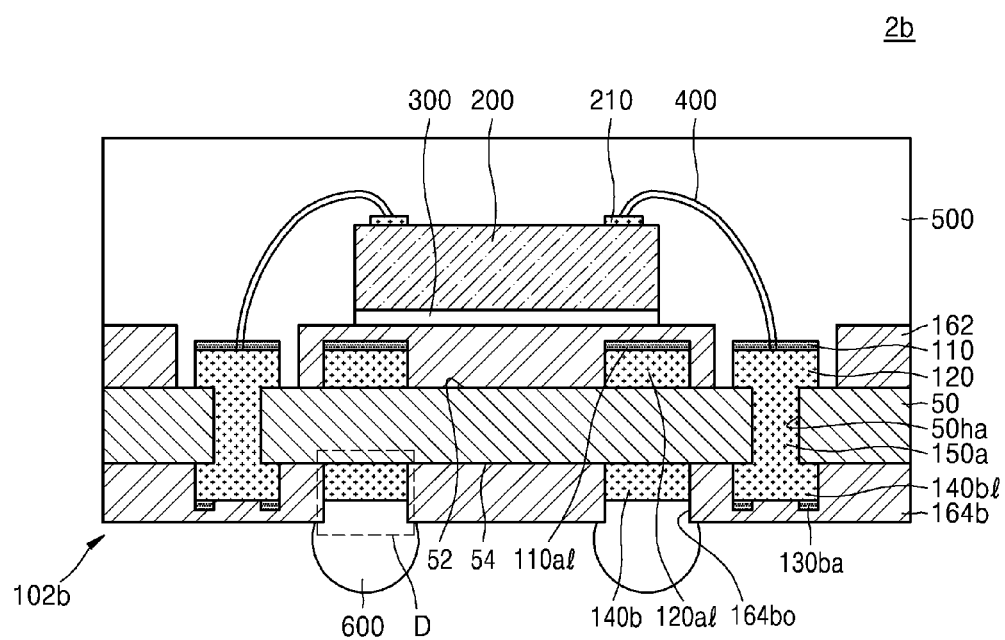
FIG. 4B is a cross-sectional view of a semiconductor package according to an exemplary embodiment of the present inventive concept.

FIG. 4B is a cross-sectional view of a semiconductor package according to an exemplary embodiment. Descriptions of FIG. 4B identical to the descriptions already provided above with reference to FIGS. 2H and 3B will be omitted.

Figure 4C:
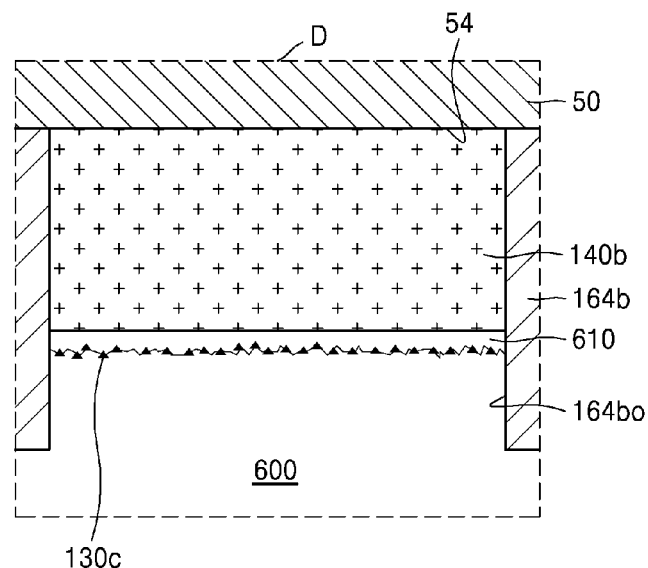
FIG. 4C is an enlarged cross-sectional view of a portion of a semiconductor package according to an exemplary embodiment of the present inventive concept.

Referring to FIG. 4B, a semiconductor package 2b includes the PCB 102b and the semiconductor chip 200. The solder joint 600 is attached onto the second connection pad 140b. A second intermetallic compound 610 of FIG. 4C is disposed between the second connection pad 140b and the solder joint 600. Second fragments 130c of FIG. 4C are arranged at the interface between the solder joint 600 and the second intermetallic compound 610.

FIG. 4C is an enlarged cross-sectional view of a portion of a semiconductor package according to an exemplary embodiment. FIG. 4C is an enlarged cross-sectional view of D of FIG. 4B. Descriptions of FIG. 4C identical to the descriptions already provided above with reference to FIGS. 2I and 3C will be omitted.

Referring to FIG. 4C, the solder joint 600 is connected to the second connection pad 140b via the second intermetallic compound 610. The second fragments 130c are disposed at both a portion of the interface between the second intermetallic compound 610 and the solder joint 600 that overlaps the via wire 150a in a vertical direction and a portion of the interface that does not overlap the via wire 150a in the vertical direction.

Furthermore, like the structure shown in FIG. 3B, if the second solder resist layer 164b covers at least a portion of a second pad cover layer 130b in FIG. 4B instead of the second pad cover layer 130a of FIG. 3B, a portion of the second pad cover layer 130b may remain between the second solder resist layer 164b and the second connection pad 140b.

Figure 4D:
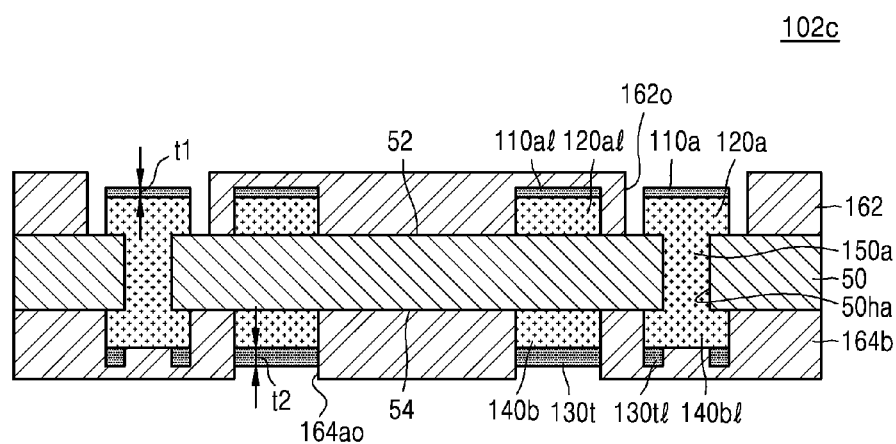
FIG. 4D is a cross-sectional view of a PCB according to an exemplary embodiment of the present inventive concept.

FIG. 4D is a cross-sectional view of a PCB according to an exemplary embodiment. Descriptions of FIG. 4D identical to the descriptions already provided above with reference to FIGS. 4A through 4C will be omitted.

Referring to FIG. 4D, a PCB 102c includes the base substrate layer 50, the first pad cover layer 110a disposed on the first connection pad 120a, and a second pad cover layer 130t disposed on the second connection pad 140b.

The first pad cover layer 110a has a first thickness t1 and the second pad cover layer 130t has a second thickness t2 that is equal to or greater than the first thickness t1. For example, the first thickness t1 may be equal to or greater than 0.5 nm and less than or equal to 5 nm, and the second thickness t2 may be equal to or greater than 0.5 nm and less than or equal to 100 nm. A second wire cover layer 130t1 may have the same thickness as the second pad cover layer 130t.

As shown in FIGS. 4B and 4C, if the solder joint 600 is attached onto the second connection pad 140b covering the second pad cover layer 130t, portions of the second pad cover layer 130t may be broken during a thermocompression operation or a reflow operation for connecting the solder joint 600 to the second connection pad 140b or may be broken down by solder flux, and thus the second fragments 130c may be formed.

According to an exemplary embodiment, even if the second pad cover layer 130t is thicker than the first pad cover layer 110a, the second pad cover layer 130t may be broken down to form the second fragments 130c in the operation for connecting the solder joint 600 to the second connection pad 140b.

Figure 6A:
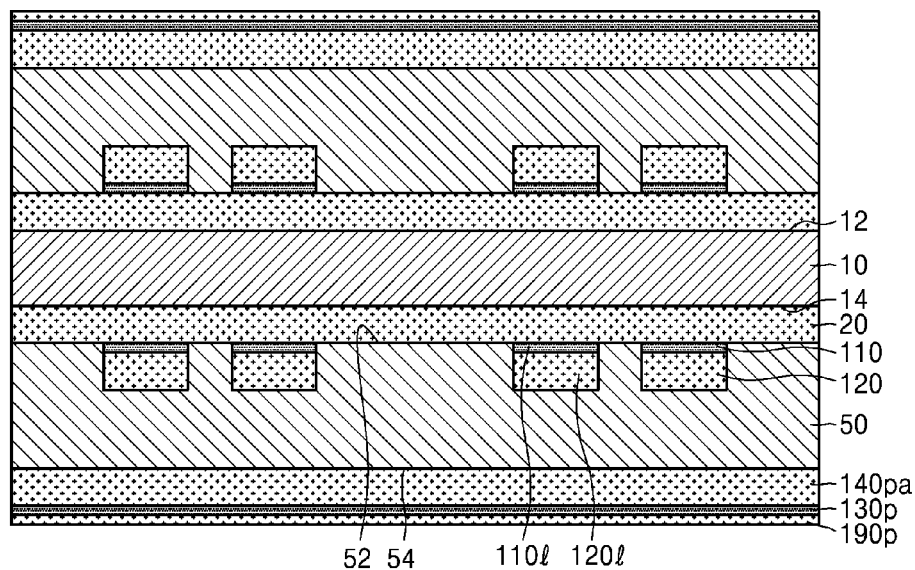
FIGS. 6A through 6H are cross-sectional diagrams showing a method of fabricating a PCB, according to an exemplary embodiment of the present inventive concept.
Figure 6B:
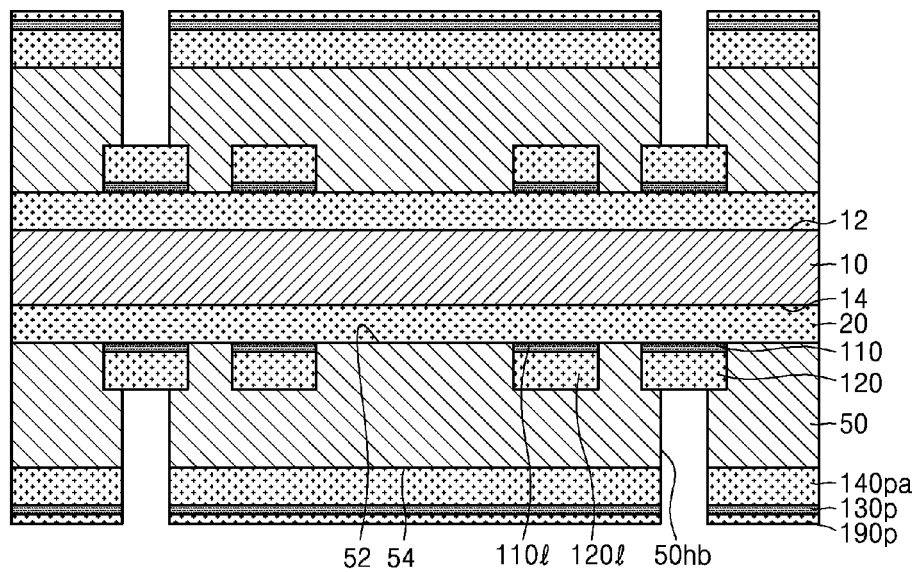
Figure 6C:
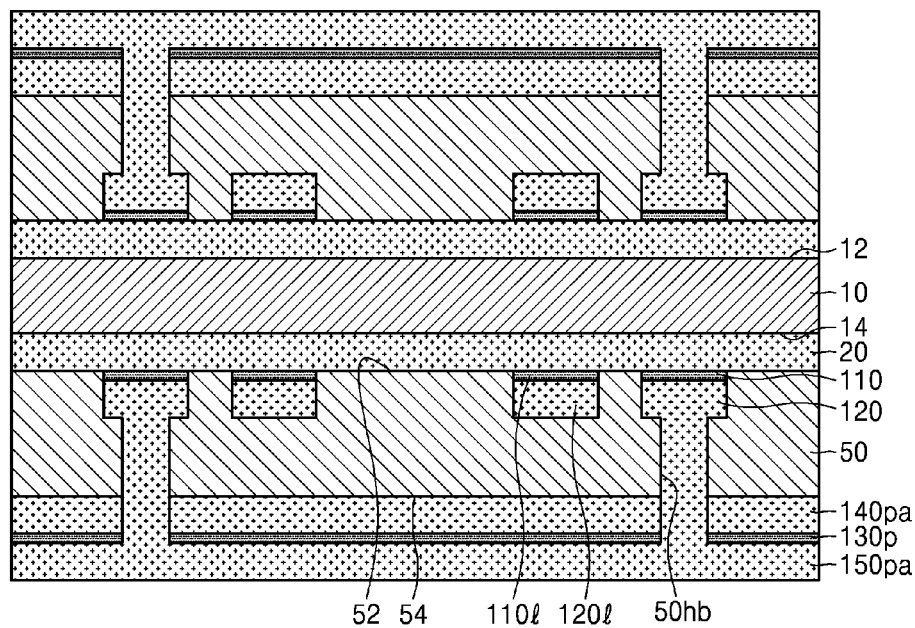
Figure 6D:
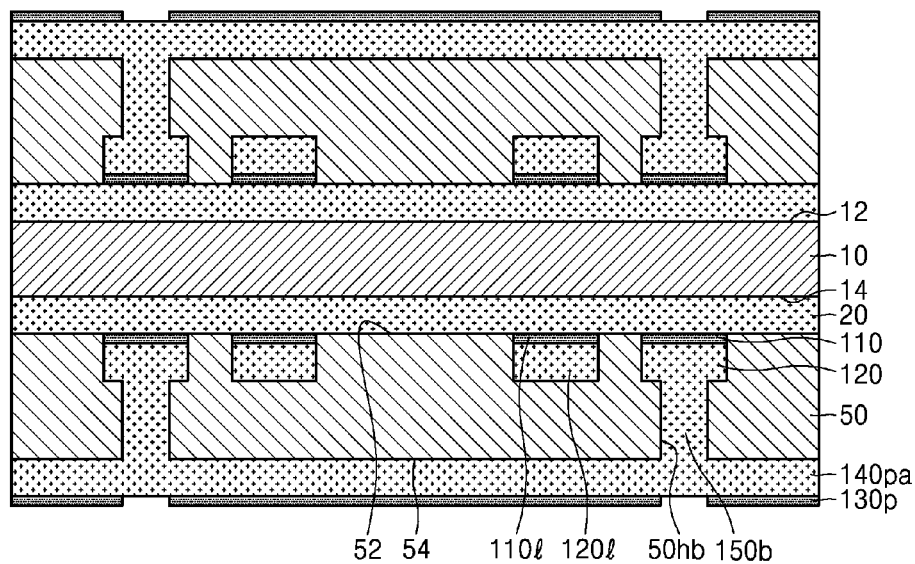
Figure 6E:
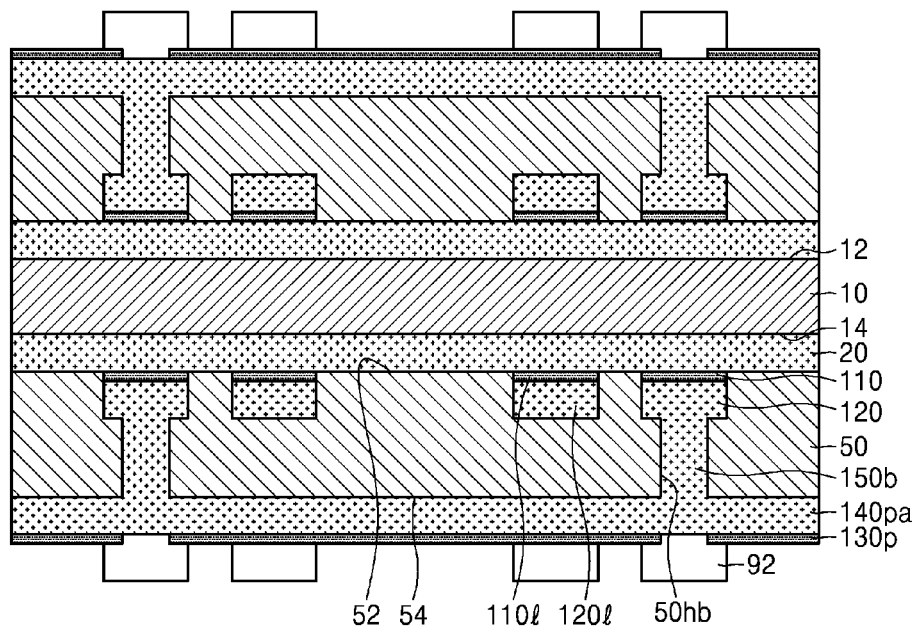
Figure 6F:
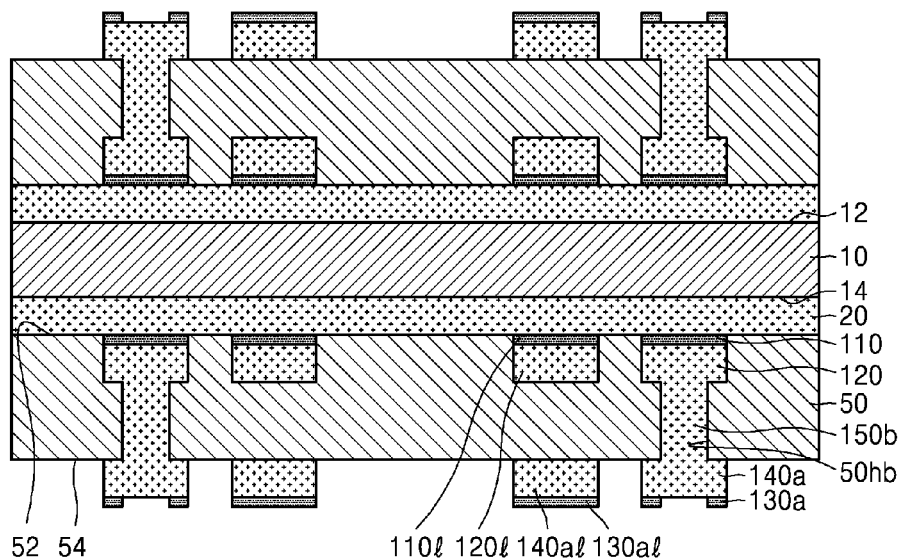
Figure 6G:
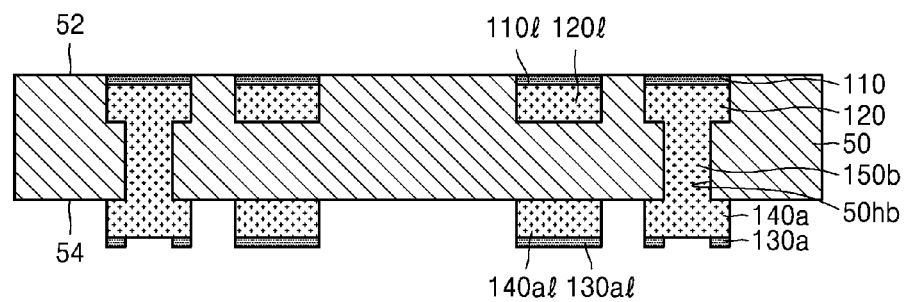
Figure 6H:
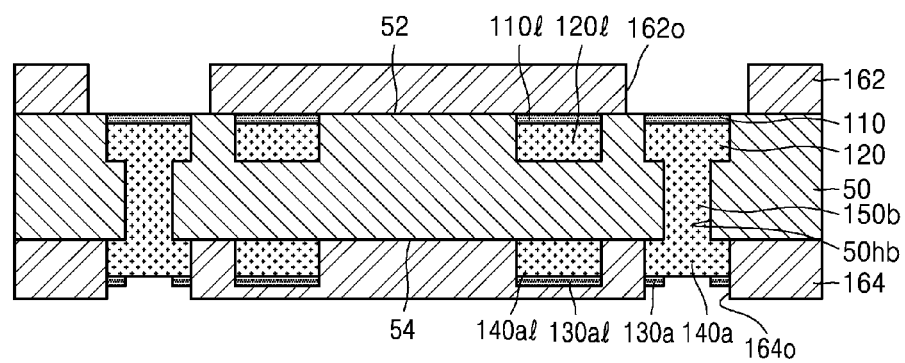

Furthermore, although not separately shown, the second pad cover layer 130a and the second wire cover layer 130a1 of each of the PCBs 100a, 102a, and 100b of FIGS. 2G, 3A, and 6H may be disposed to have greater thicknesses than the first pad cover layers 110 and 110a.

FIGS. 5A through 5F are cross-sectional diagrams showing a method of fabricating a PCB, according to an exemplary embodiment.

Figure 5A:
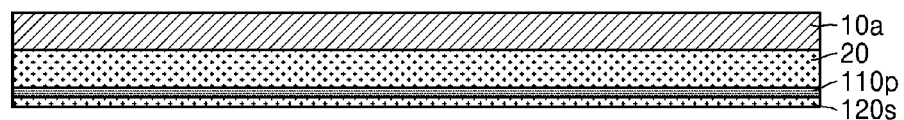
FIGS. 5A through 5F are cross-sectional diagrams showing a method of fabricating a PCB, according to an exemplary embodiment of the present inventive concept.

Referring to FIG. 5A, a carrier substrate 10a including the dummy layer 20, the insulating metal oxide layer 110p, and the first seed layer 120s on a surface thereof is prepared.

Figure 5B:
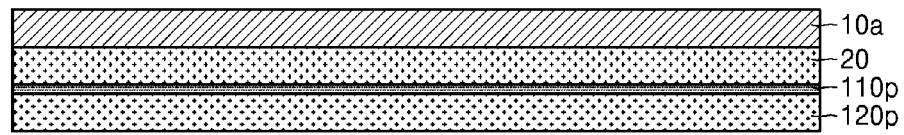

Referring to FIGS. 5A and 5B, the first plating layer 120p is disposed by performing plating using the first seed layer 120s as a seed.

Figure 5C:
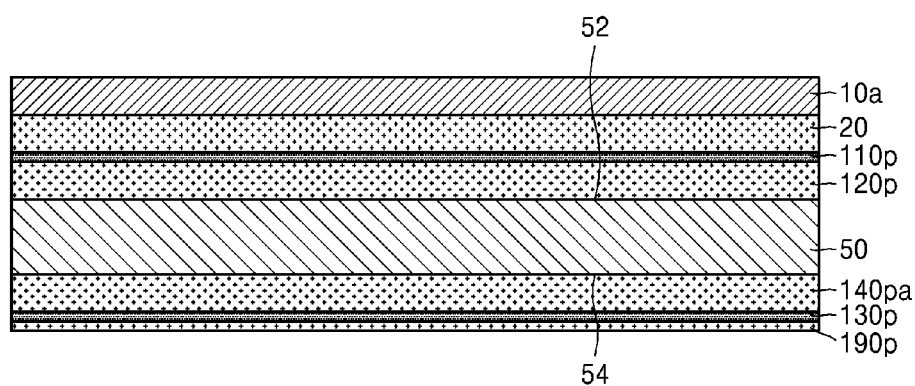

Referring to FIG. 5C, after the base substrate layer 50 is prepared, the first surface 52 of the base substrate layer 50 is attached to the first plating layer 120p via a laminating operation.

The second metal layer 140pa, the second insulating metal oxide layer 130p, and the second metal protection layer 190p are stacked on the second surface 54 of the base substrate layer 50. According to an exemplary embodiment, the second metal layer 140pa, the second insulating metal oxide layer 130p, and the second metal protection layer 190p may be stacked on the second surface 54 of the base substrate layer 50 before the base substrate layer 50 is attached onto the first plating layer 120p. According to an exemplary embodiment, the second metal layer 140pa, the second insulating metal oxide layer 130p, and the second metal protection layer 190p may be stacked on the base substrate layer 50 after the base substrate layer 50 is attached onto the first plating layer 120p.

Figure 5D:
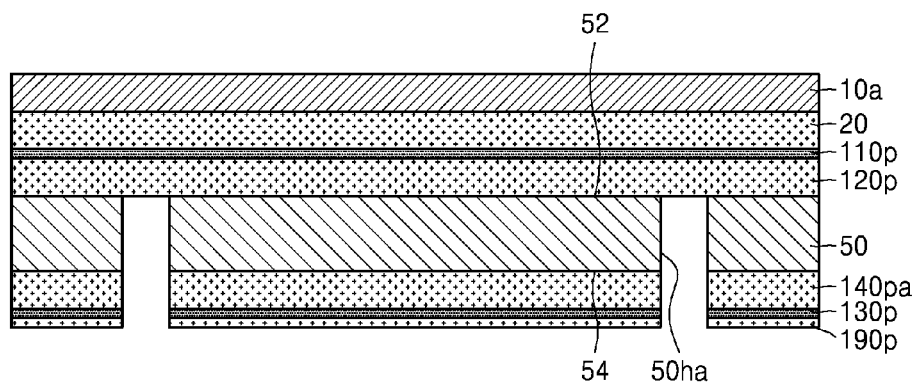

Referring to FIG. 5D, the via hole 50ha is formed such that it penetrates through the second metal protection layer 190p, the second insulating metal oxide layer 130p, the second metal layer 140pa, and the base substrate layer 50 and exposes a portion of the first plating layer 120p.

Figure 5E:
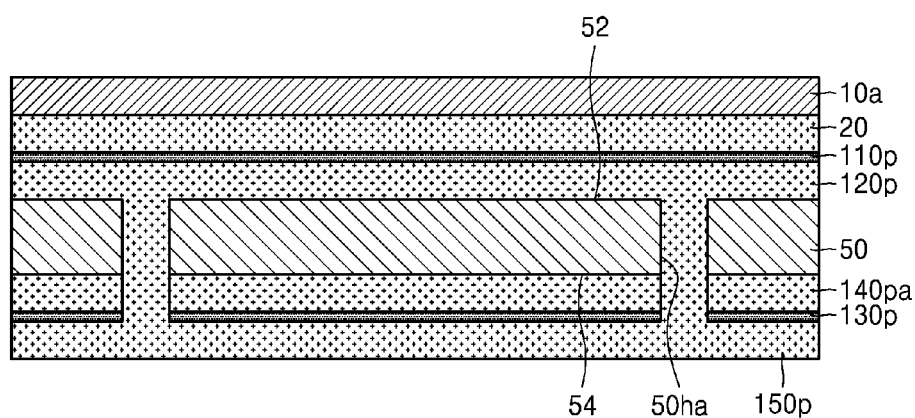

Referring to FIGS. 5D and 5E, the via layer 150p may be disposed by performing plating using the second metal protection layer 190p and a portion of the first plating layer 120p exposed by the via hole 50ha as seeds.

Figure 5F:
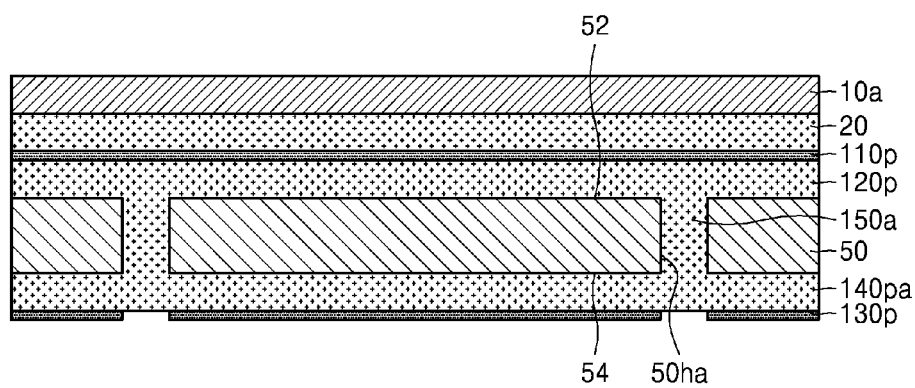

Referring to FIGS. 5E and 5F, a portion of the via layer 150p covering the second insulating metal oxide layer 130p is removed to form the via wire 150a.

Throughout the present specification, a portion of the via layer 150p that remains at the same level as the second metal layer 140pa in FIG. 5D is considered to be a portion of the second metal layer 140pa for convenience of explanation, and a portion of the via layer 150p filling the via hole 50ha is referred to as the via wire 150a.

After the carrier substrate 10a and the dummy layer 20 are removed, a PCB may be fabricated according to the method described above with reference to FIGS. 2E through 2G.

FIGS. 6A through 6H are cross-sectional diagrams showing a method of fabricating a PCB, according to an exemplary embodiment.

Referring to FIG. 6A, the dummy layer 20 is disposed on both the top surface 12 and the bottom surface 14 of the carrier substrate 10, and the insulating metal oxide patterns including the first pad cover layer 110 and the wire cover layer 110l and the first plating patterns including the first connection pad 120 and the first wire 120l are disposed on the dummy layer 20 according to the method described above with reference to FIGS. 1A through 1C.

Next, the base substrate layer 50 surrounding the first insulating metal oxide patterns and the first plating patterns are respectively attached onto the top surface 12 and the bottom surface 14 of the carrier substrate 10.

The base substrate layer 50 may be respectively attached onto the top surface 12 and the bottom surface 14 of the carrier substrate 10, such that the first surface 52 faces toward the carrier substrate 10. The second metal layer 140pa, the second insulating metal oxide layer 130p, and the second metal protection layer 190p are stacked on the second surface 54 of the base substrate layer 50.

Referring to FIG. 6B, a via hole 50hb is formed such that it penetrates through the second metal protection layer 190p, the second insulating metal oxide layer 130p, the second metal layer 140pa, and the base substrate layer 50 and exposes at least a portion of the top surface of the first connection pad 120.

Referring to FIGS. 6B and 6C, a via layer 150pa may be disposed by performing plating using the second metal protection layer 190p and a portion of the first connection pad 120 exposed by the via hole 50hb as seeds.

Referring to FIGS. 6C and 6D, a portion of the via layer 150pa covering the second insulating metal oxide layer 130p is removed to dispose a via wire 150b.

Throughout the present specification, a portion of the via layer 150pa that remains at the same level as the second metal layer 140pa of FIG. 6C is considered as a portion of the second metal layer 140pa for convenience of explanation, and a portion of the via layer 150pa filling the via hole 50hb is referred to as the via wire 150b.

Referring to FIG. 6E, a mask layer 92 covering a portion of the top surface of the second insulating metal oxide layer 130p is disposed. Although FIG. 6E shows that the mask layer 92 also covers a portion of the second metal layer 140pa that is exposed without being covered by the second insulating metal oxide layer 130p, the present inventive concept is not limited thereto.

Referring to FIG. 6F, the second insulating metal oxide layer 130p and the second metal layer 140pa are patterned by using the mask layer 90 as an etching mask, thereby disposing the second insulating metal oxide patterns including the second pad cover layer 130a and the second wire cover layer 130a1 and the second metal patterns including the second connection pad 140a and the second wire 140a1.

Referring to FIGS. 6F and 6G together, the carrier substrate 10 is separated from the base substrate layer 50. According to an exemplary embodiment, the dummy layer 20 may be removed together during the separation of the carrier substrate 10. According to an exemplary embodiment, a portion of the dummy layer 20 that remains on a first surface 52 of the base substrate layer 50 during the separation of the carrier substrate 10 may be removed separately.

Referring to FIG. 6H, the first solder resist layer 162 and the second solder resist layer 164 are respectively disposed on the first surface 52 and the second surface 54 of the base substrate layer 50, thereby fabricating the PCB 100b.

The first connection pad 120, the first wire 120l, the first pad cover layer 110, and the first wire cover layer 110l of the PCB 100b of FIG. 6H are substantially identical to the first connection pad 120, the first wire 120l, the first pad cover layer 110, and the wire cover layer 110l of the PCB 100 of FIG. 1K, and the second connection pad 140a, the second wire 140a1, the second pad cover layer 130a, and the second wire cover layer 130a1 of the PCB 100b of FIG. 6H are substantially identical to the second connection pad 140a, the second wire 140a1, the second pad cover layer 130a, and the second wire cover layer 130a1 of FIG. 2G. Therefore, further detailed descriptions thereof will be omitted.

A semiconductor package including the PCB 100b may also correspond to a combination of the semiconductor package 1 shown in FIG. 1L and the semiconductor package 2 shown in FIG. 2H, and thus, the semiconductor package including the PCB 100b will not be separately illustrated.

Figure 7:
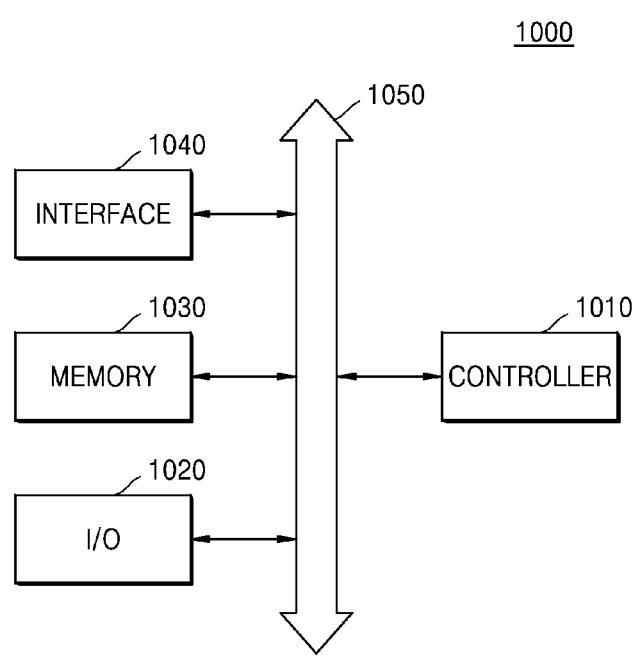
FIG. 7 is a block diagram of an electronic system according to an exemplary embodiment of the present inventive concept.

FIG. 7 is a block diagram of an electronic system according to an exemplary embodiment.

Referring to FIG. 7, an electronic system 1000 includes a controller 1010, an input/output (I/O) device 1020, a memory 1030, and an interface 1040. The components are connected to one another via a bus 1050.

The controller 1010 may include at least one of a microprocessor, a digital signal processor, or a similar processing device. The I/O device 1020 may include at least one of a keypad, a keyboard, and a display. The memory 1030 may be used to store instructions executed by controller 1010. For example, the memory 1030 may be used to store user data.

The electronic system 1000 may constitute a wireless communication device or a device capable of transmitting and/or receiving information in a wireless communication environment. In the electronic system 1000, the interface 1040 may be configured as a wireless interface to transmit/receive data over a wireless communication network. The interface 1040 may include an antenna or a wireless transceiver. According to an exemplary embodiment, the electronic system 1000 may be used for a communication interface protocol of a third generation communication system, such as code division multiple access (CDMA), global system for mobile communications (GSM), North American digital cellular (NADC), extended-time division multiple access (WCDMA), or wideband code division multiple access (WCDMA).

The electronic system 1000 may include at least one of a PCB and/or a semiconductor package as described above with reference to FIGS. 1A through 6H and a PCB or a semiconductor package fabricated according to various fabricating methods modified and changed within the inventive concept.

In a PCB according to the present inventive concept and a semiconductor package having the same, a connection pad is protected from oxidation or contamination by a pad cover layer, and a bonding wire or a solder joint may penetrate or break through the pad cover layer and be connected to the connection pad. Therefore, interconnection between the connection pad and the bonding wire or the solder joint may be reliable.

While the inventive concept has been particularly shown and described with reference to embodiments thereof, it will be understood that various changes in form and details may be made therein without departing from the spirit and scope of the following claims.

What is claimed is:

1. A printed circuit board (PCB) comprising:
   a base substrate layer;
   a first connection pad and a second connection pad disposed on a first surface and a second surface of the base substrate layer, respectively,
   wherein the first connection pad includes a top surface and a plurality of side surfaces extending from the top surface to the first surface of the base substrate layer,
   and wherein the first connection pad and the second connection pad each comprises a first metal;
   a first pad cover layer covering the top surface of the first connection pad and comprising an insulating metal oxide having a second metal different from the first metal;
   a first wire disposed on the first surface of the base substrate layer and located at a same level as the first connection pad with respect to the second surface of the base substrate layer, wherein the first wire comprises a same material as the first connection pad;
   a first wire cover layer covering a top surface of the first wire and comprising a same material as the first pad cover layer; and
   a first solder resist layer disposed on the first surface of the base substrate layer to cover entirely a top surface of the first wire cover layer without covering a portion of the first pad cover layer,
   wherein the first pad cover layer is absent from the plurality of side surfaces of the first connection pad.

2. The PCB of claim 1,
   wherein the first connection pad is embedded in the base substrate layer.

3. The PCB of claim 1, further comprising:
   a second pad cover layer covering a top surface of the second connection pad and comprising an insulating metal oxide having the second metal.

4. The PCB of claim 3, further comprising:
   a second wire disposed on the second surface of the base substrate layer to be located at a same level as the second connection pad with respect to the first surface of the base substrate layer, wherein the second wire comprises a same material as the second connection pad;
   a second wire cover layer covering a top surface of the second wire and comprising a same material as the second pad cover layer; and
   a second solder resist layer disposed on the second surface of the base substrate layer to cover entirely a top surface of the second wire cover layer without covering a portion of the second pad cover layer.

5. The PCB of claim 4,
   wherein the second connection pad protrudes from the second surface of the base substrate layer.

6. The PCB of claim 3,
   wherein a thickness of the second pad cover layer is greater than a thickness of the first pad cover layer, and
   wherein the thickness of the first pad cover layer is less than about 5.0 nm.

7. A semiconductor package comprising:
   a base substrate layer;
   a first connection pad and a second connection pad disposed on a first surface and a second surface of the base substrate layer, respectively,
   wherein the first connection pad and the second connection pad each comprises a first metal and wherein the first connection pad includes a top surface and a plurality of side surfaces extending from the top surface to the first surface of the base substrate layer;
   a first pad cover layer covering the top surface of the first connection pad and comprising an insulating metal oxide having a second metal different from the first metal, wherein the first pad cover layer is absent from the plurality of side surfaces of the first connection pad;
   a semiconductor chip comprising a chip pad; and
   a bonding wire comprising a first end connected to the chip pad and a second end connected to the first connection pad through the first pad cover layer,
   wherein the bonding wire comprises a third metal different from the first metal; and
   a first intermetallic compound arranged between the second end of the bonding wire and the first connection pad, wherein the first intermetallic compound is a compound of the first metal and the third metal; and
   first fragments arranged at an interface between the second end of the bonding wire and the first intermetallic compound, wherein the first fragments comprise a same material as the first pad cover layer.

8. The semiconductor package of claim 7, further comprising:
   a first wire disposed on the first surface of the base substrate layer and located at a same level as the first connection pad with respect to the second surface of the base substrate layer,
   wherein the first wire comprises a same material as the first connection pad;

a wire cover layer covering entirely a top surface of the first wire and comprising a same material as the first pad cover layer; and a first solder resist layer disposed on the first surface of the base substrate layer to cover entirely a top surface of the wire cover layer without covering a portion of the first pad cover layer.

9. The semiconductor package of claim 7, further comprising:

a solder joint attached onto the second connection pad and comprising a fourth metal;

a second intermetallic compound arranged between the second connection pad and the solder joint, wherein the second intermetallic compound is a compound of the first metal and the fourth metal; and second fragments arranged at an interface between the solder joint and the second intermetallic compound and comprising an insulating metal oxide having the second metal.

10. The semiconductor package of claim 9, further comprising:

a second pad cover layer covering a portion of the second connection pad and comprising an insulating metal oxide having the second metal.

11. The semiconductor package of claim 10, further comprising:

a second solder resist layer disposed on the second surface of the base substrate layer to cover a top surface of the second pad cover layer.

12. The semiconductor package of claim 9, further comprising:

a via wire penetrating the base substrate layer, wherein the via wire connects electrically the first connection pad to the second connection pad, and wherein the second fragments are arranged at a portion of the interface between the solder joint and the second intermetallic compound that does not overlap the via wire in a vertical direction and are not arranged at a portion of the interface that overlaps the via wire in the vertical direction.

13. The semiconductor package of claim 7, wherein the bonding wire penetrates the first pad cover layer to be in contact with the first connection pad.

14. A semiconductor package comprising:

a printed circuit board (PCB) comprising:

a base substrate layer, a first connection pad and a second connection pad disposed on a first surface and a second surface of the base substrate layer, respectively, wherein the first connection pad includes a top surface and a plurality of side surfaces extending from the top surface to the first surface of the base substrate layer, and a first pad cover layer covering the top surface of the first connection pad, wherein the first pad cover layer is absent from the plurality of side surfaces of the first connection pad; and a semiconductor chip comprising a chip pad;

a bonding wire comprising a first end connected to the chip pad and a second end connected to the first connection pad through the first pad cover layer, wherein the first pad cover layer has a thickness less than about 5.0 nm;

a solder joint attached onto the second connection pad;

a first intermetallic compound arranged between the second end of the bonding wire and the first connection pad; and fragments arranged at an interface between the second end of the bonding wire and the first intermetallic compound, wherein the fragments comprise a same material as the first pad cover layer.

15. The semiconductor package of claim 14, wherein the first connection pad comprises copper, and wherein the first pad cover layer comprises aluminum oxide.

16. The semiconductor package of claim 14, further comprising a second intermetallic compound arranged between the second connection pad and the solder joint.

17. The semiconductor package of claim 14, wherein the first connection pad is non-overlapped with the second connection pad.

18. The semiconductor package of claim 17, further comprising:

a second pad cover layer covering a portion of a top surface of the second connection pad; and a solder resist layer covering the second pad cover layer and the top surface of the second connection pad, wherein the second pad cover layer is disposed between the solder resist layer and the second connection pad.

* * * * *